US009595545B2

(12) United States Patent
Misaki

(10) Patent No.: US 9,595,545 B2
(45) Date of Patent: Mar. 14, 2017

(54) SEMICONDUCTOR DEVICE

(71) Applicant: Sharp Kabushiki Kaisha, Osaka-shi, Osaka (JP)

(72) Inventor: Katsunori Misaki, Yonago (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/762,878

(22) PCT Filed: Jan. 23, 2014

(86) PCT No.: PCT/JP2014/051391
§ 371 (c)(1),
(2) Date: Jul. 23, 2015

(87) PCT Pub. No.: WO2014/115810
PCT Pub. Date: Jul. 31, 2014

(65) Prior Publication Data
US 2015/0372025 A1 Dec. 24, 2015

(30) Foreign Application Priority Data

Jan. 25, 2013 (JP) .................................. 2013-011678

(51) Int. Cl.
*H01L 27/02* (2006.01)
*G02F 1/1362* (2006.01)
(Continued)

(52) U.S. Cl.
CPC .... *H01L 27/1248* (2013.01); *G02F 1/136204* (2013.01); *H01L 27/0248* (2013.01);
(Continued)

(58) Field of Classification Search
CPC ............. H01L 27/1248; H01L 27/1225; H01L 27/124; H01L 27/0296; H01L 27/1214;
(Continued)

(56) References Cited

U.S. PATENT DOCUMENTS 8,330,883 B2* 12/2012 Tsubata ................. G02F 1/1345
349/138
2004/0066637 A1* 4/2004 Imai .................. G02F 1/136204
361/777
(Continued)

FOREIGN PATENT DOCUMENTS

JP 2006-146200 A 6/2006
JP 2008-176256 A 7/2008

*Primary Examiner* — Galina Yushina
(74) *Attorney, Agent, or Firm* — Keating & Bennett, LLP

(57) ABSTRACT

A semiconductor device (100) includes: a first line (8) having a first end portion (8T); a second line (2) being insulated from the first line and having a second end portion (2T); a first electrically-conductive portion (9) provided in the neighborhood of the first and second end portions so as to be spaced apart therefrom; a dielectric layer (20) covering them; and a second electrically-conductive portion (38) on the dielectric layer. The dielectric layer (20) has a first contact hole (CH1) overlapping the first end portion and a second contact hole (CH2) overlapping the first electrically-conductive portion; the second electrically-conductive portion (38) is connected with the first end portion (8T) and the first electrically-conductive portion (9) within the first contact hole (CH1) and the second contact hole (CH2); the second end portion (2T) is insulated from the first electrically-conductive portion (9); the first electrically-conductive portion (9) includes a proximate portion (9T) protruding toward the first end portion; and the dielectric layer (20) has a first hole (H1) overlapping the proximate portion (9T) of the first electrically-conductive portion.

20 Claims, 27 Drawing Sheets

(51) Int. Cl.
*H01L 27/12* (2006.01)
*G02F 1/1345* (2006.01)

(52) U.S. Cl.
CPC ........ *H01L 27/0296* (2013.01); *H01L 27/124* (2013.01); *H01L 27/1225* (2013.01); *G02F 1/13452* (2013.01); *G02F 1/136286* (2013.01)

(58) Field of Classification Search
CPC ............. H01L 27/1244; H01L 27/1255; H01L 27/0248; H01L 2224/752; G02F 1/13452; G02F 1/136204; G02F 1/136286; G02F 1/13454; G02F 1/1362; G02F 1/135213
See application file for complete search history.

(56) References Cited

U.S. PATENT DOCUMENTS

| | | |
|---|---|---|
| 2006/0103772 A1 | 5/2006 | Lee |
| 2008/0174238 A1 | 7/2008 | Jeong et al. |
| 2011/0063199 A1* | 3/2011 | Yamashita ........ G02F 1/136286 345/87 |

* cited by examiner

FIG. 1 COMPARATIVE EXAMPLE

FIG.2 COMPARATIVE EXAMPLE

FIG. 5 COMPARATIVE EXAMPLE

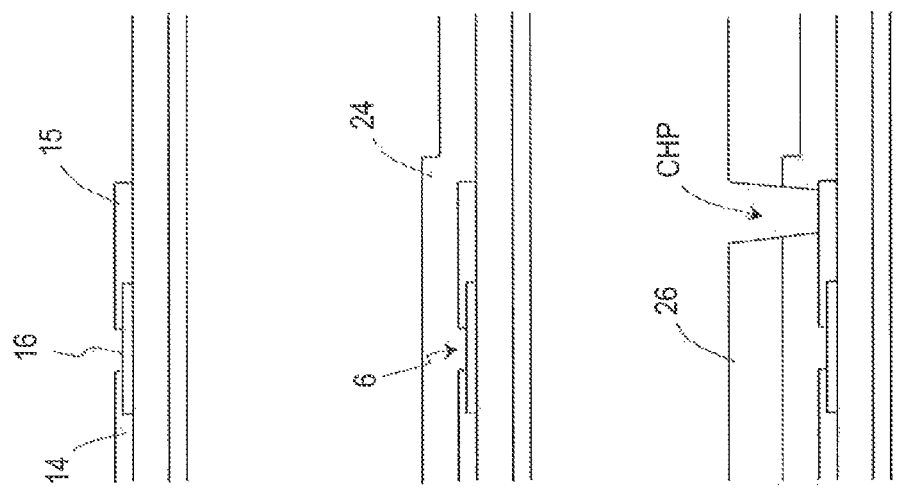
FIG. 17
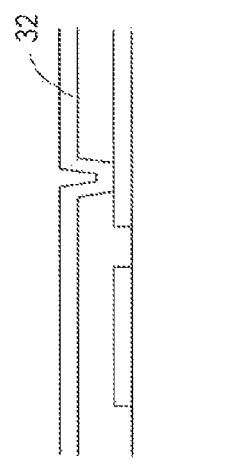
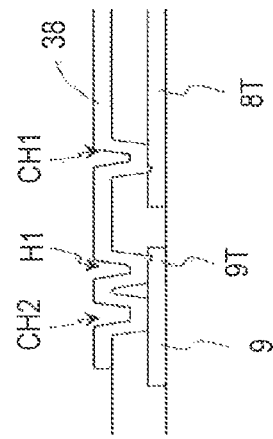

FIG.18
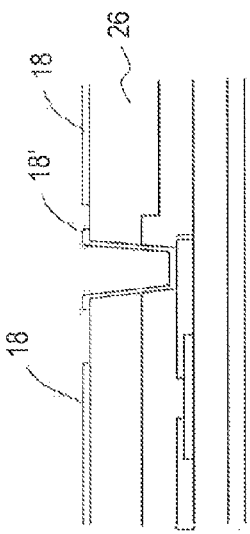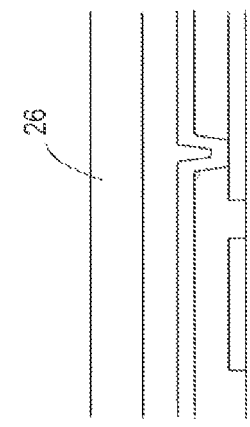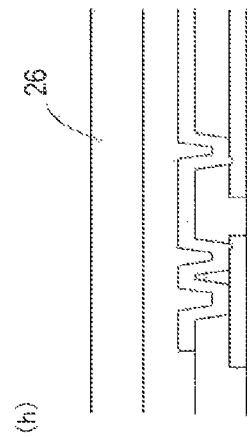
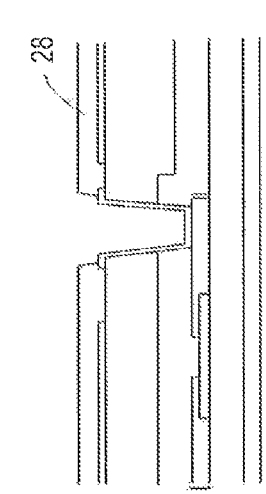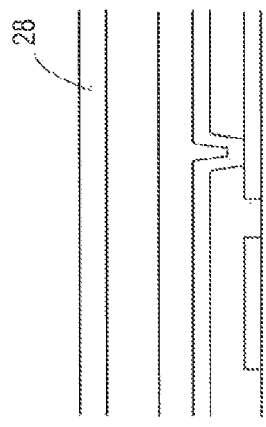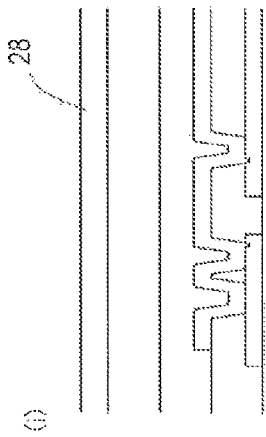
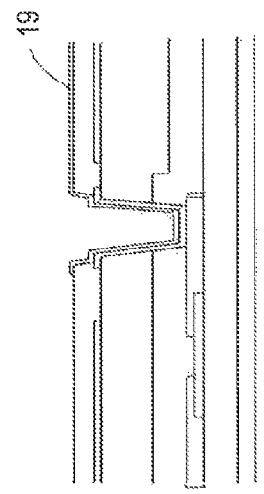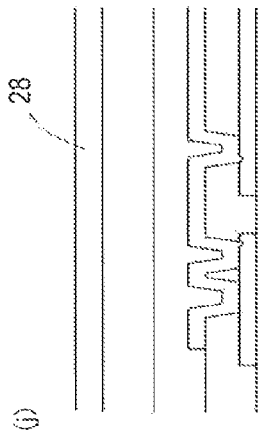

SEMICONDUCTOR DEVICE

TECHNICAL FIELD

The present invention relates to a semiconductor device, and more particularly to a semiconductor device for use in display devices or the like.

BACKGROUND ART

Active matrix substrates that are used for liquid crystal display devices and the like include a switching element for each pixel, e.g., a thin film transistor (hereinafter, "TFT"). As such switching elements, TFTs whose active layers are an amorphous silicon film and TFTs whose active layers are a polycrystalline silicon film have been widely used. In recent years, TFTs in which an oxide semiconductor is used instead of a silicon semiconductor have also been realized. Such TFTs are referred to as "oxide semiconductor TFTs".

Now, an active matrix substrate has various circuits formed thereon, including semiconductor elements (which typically are TFTs). Circuits for protecting the semiconductor elements from ESD (electrostatic discharge; Electro-Static Discharge) are often provided. Such circuits are called ESD protection circuits, and function to prevent destruction of semiconductor elements due to electrostatic discharge.

An ESD protection circuit may be provided in the peripheral region (frame region) of the active matrix substrate, and includes, for example, two thin film diodes of different polarities connected to a gate line and a source line. These thin film diodes are connected to a reference potential line, for example. By using these, a charge which is accumulated in the gate line or source line can be released to the reference potential line.

However, introducing a conventional ESD protection circuit to a monolithic driver, for example, would lead to enlargement of the frame region of the display device. Therefore, Patent Document 1 discloses a technique which employs an ESD protection circuit of a simpler construction to allow the static electricity occurring in the substrate to be discharged at remote sites from semiconductor elements such as TFTs.

In the display device described in Patent Document 1, a portion (discharging portion) for promoting discharge is provided at the end portion of a scanning line (gate line). At this discharging portion, the end portion of a scanning line having a pointed shape and the end portion of a line also having a pointed shape oppose each other with a slight gap therebetween. The discharging portions are more liable to undergo a discharge than are other portions. Thus, by allowing ESD to primarily occur at the discharging portions, ESD occurrence at TFTs or other elements can be prevented.

Patent Document 2 describes a construction in which protruding electrodes are provided in the frame region in order to prevent destruction of elements or the like due to electrostatic discharge. Thus, providing a protruding electrode is likely to induce a discharge to occur at that site. As a result, discharge is restrained from occurring at other sites.

CITATION LIST

Patent Literature

[Patent Document 1] Japanese Laid-Open Patent Publication No. 2006-146200

[Patent Document 2] Japanese Laid-Open Patent Publication No. 2008-176256

SUMMARY OF INVENTION

Technical Problem

However, in the active matrix substrates or the like used in liquid crystal display devices, the conventional practice of merely providing protection circuits for preventing ESD at the TFTs may not have been able to prevent defective conditions caused by ESD.

A study by the inventors has found the following. In a semiconductor device fabrication process, after a lower electrically-conductive layer is provided, an upper electrically-conductive layer may sometimes be provided via a dielectric layer; ESD may occur when contact holes are made in this dielectric layer, for example. At that time, unwanted pinholes may be formed in the dielectric layer. If any pinhole is formed at a position where the upper electrically-conductive layer, which is to be insulated from the lower electrically-conductive layer by the intervening dielectric layer, is provided, short-circuiting may occur and thereby induce defective conditions.

The present invention has been made in order to solve the above problems, and an objective thereof is to provide a semiconductor device which prevents defective conditions due to destruction of a dielectric layer that may result from ESD.

Solution to Problem

A semiconductor device according to an embodiment of the present invention comprises: a substrate; a first line being formed on the substrate and having a first end portion; a second line having a second end portion located in a neighborhood of the first end portion, the second line being insulated from the first line; a first electrically-conductive portion provided in the neighborhood of the first end portion and the second end portion, the first electrically-conductive portion being spaced apart from the first end portion and from the second end portion when viewed from a substrate normal direction, and extending in a different direction from that of the first line and the second line; a dielectric layer covering the first line, the second line, and the first electrically-conductive portion; and a second electrically-conductive portion provided on the dielectric layer, wherein, when viewed from the substrate normal direction, the dielectric layer has a first contact hole at least partially overlapping the first end portion and a second contact hole at least partially overlapping the first electrically-conductive portion; the second electrically-conductive portion is connected to the first end portion within the first contact hole and connected to the first electrically-conductive portion within the second contact hole to allow electrical conduction between the first end portion and the first electrically-conductive portion; the second end portion is insulated from the first electrically-conductive portion; the first electrically-conductive portion has a proximate portion protruding toward the first end portion in the neighborhood of the first end portion; and the dielectric layer further has a first hole disposed so as to at least partially overlap the proximate portion of the first electrically-conductive portion when viewed from the substrate normal direction.

In one embodiment, the dielectric layer has a third contact hole at least partially overlapping the second end portion, the semiconductor device further comprising: a third electrically-conductive portion being electrically connected to the second end portion within the third contact hole, and being electrically insulated from the first end portion, the first electrically-conductive portion, and the second electrically-conductive portion.

In one embodiment, the dielectric layer has an electrostatic discharge-damaged portion at least within the first hole, and the dielectric layer has no electrostatic discharge-damaged portion within the third contact hole.

In one embodiment, the first hole penetrates through the dielectric layer to expose at least a portion of the proximate portion.

In one embodiment, the first line and the second line are provided in a same layer, and the first line and the second line extend in parallel to each other.

In one embodiment, the second electrically-conductive portion integrally covers the first contact hole, the second contact hole, and the first hole.

In one embodiment, a distance between the first end portion and the proximate portion of the first electrically-conductive portion is smaller than a distance between the second end portion and the first electrically-conductive portion.

In one embodiment, the first end portion includes a line proximate portion protruding in a direction different from the direction that the first line extends; and the proximate portion of the first electrically-conductive portion and the line proximate portion oppose each other.

In one embodiment, the line proximate portion of the first end portion has a second hole different from the first contact hole.

In one embodiment, the first hole and the second hole are not covered by the second electrically-conductive portion.

In one embodiment, the second end portion of the second line includes a further line proximate portion protruding in a direction different from the direction that the second line extends; the first electrically-conductive portion includes a further proximate portion at a position opposing the further line proximate portion, the further proximate portion protruding toward the further line proximate portion; and when viewed from the substrate normal direction, the dielectric layer has a third hole at least partially overlapping the further line proximate portion and a fourth hole at least partially overlapping the further proximate portion.

In one embodiment, the proximate portion of the first electrically-conductive portion includes a portion pointed toward the first end portion, and the first hole partially overlaps the pointed portion.

In one embodiment, the above semiconductor device further comprises a TFT, wherein a channel of the TFT comprises an oxide semiconductor.

In one embodiment, the semiconductor device has a displaying region and a frame region outside the displaying region, wherein, the first and second lines at least extend inside the displaying region; and the first end portion and the second end portion are located in the frame region.

A semiconductor device according to an embodiment of the present invention comprises: a first electrically-conductive layer including a first conduction pattern, a second conduction pattern, and a third conduction pattern, such that the first conduction pattern, the second conduction pattern, and the third conduction pattern are isolated from one another when viewed from a substrate normal direction; a dielectric layer covering the first electrically-conductive layer; and a second electrically-conductive layer on the dielectric layer, wherein the first conduction pattern and the second conduction pattern are electrically interconnected via a connection portion contained in the second electrically-conductive layer; the third conduction pattern is insulated from the first and second conduction patterns; and the first conduction pattern includes a portion protruding toward the second conduction pattern, and the dielectric layer has a hole at least partially overlapping the protruding portion when viewed from the substrate normal direction, thereby allowing electrostatic discharge to primarily occur in the hole.

Advantageous Effects of Invention

With a semiconductor device according to an embodiment of the present invention, decrease in production yield can be suppressed even when ESD occurs due to static electricity being generated in the substrate.

BRIEF DESCRIPTION OF DRAWINGS

FIG. 17 Cross-sectionals view for describing production steps of the TFT substrate of Example 2, where (e) to (g) show respectively different steps.

FIG. 18 Cross-sectionals view for describing production steps of the TFT substrate of Example 2, where (h) to (j) show respectively different steps.

DESCRIPTION OF EMBODIMENTS

First, before describing embodiments of the present invention, the process which causes ESD in a semiconductor device and the problems that may result from ESD, as have been confirmed by the inventors, will be described.

In the production steps of a semiconductor device, when a dielectric layer is provided on an electrically-conductive layer or a semiconductor layer and then followed by a process of opening contact holes in the dielectric layer, ESD is likely to occur. For example, when contact holes are made in a dielectric layer by a photolithography technique in the production steps of an active matrix substrate, a resist with openings is provided on the dielectric layer. ESD may occur in a step of developing this resist, thus making pinholes in the dielectric layer inside the resist openings or the neighborhood thereof.

Figure 1:
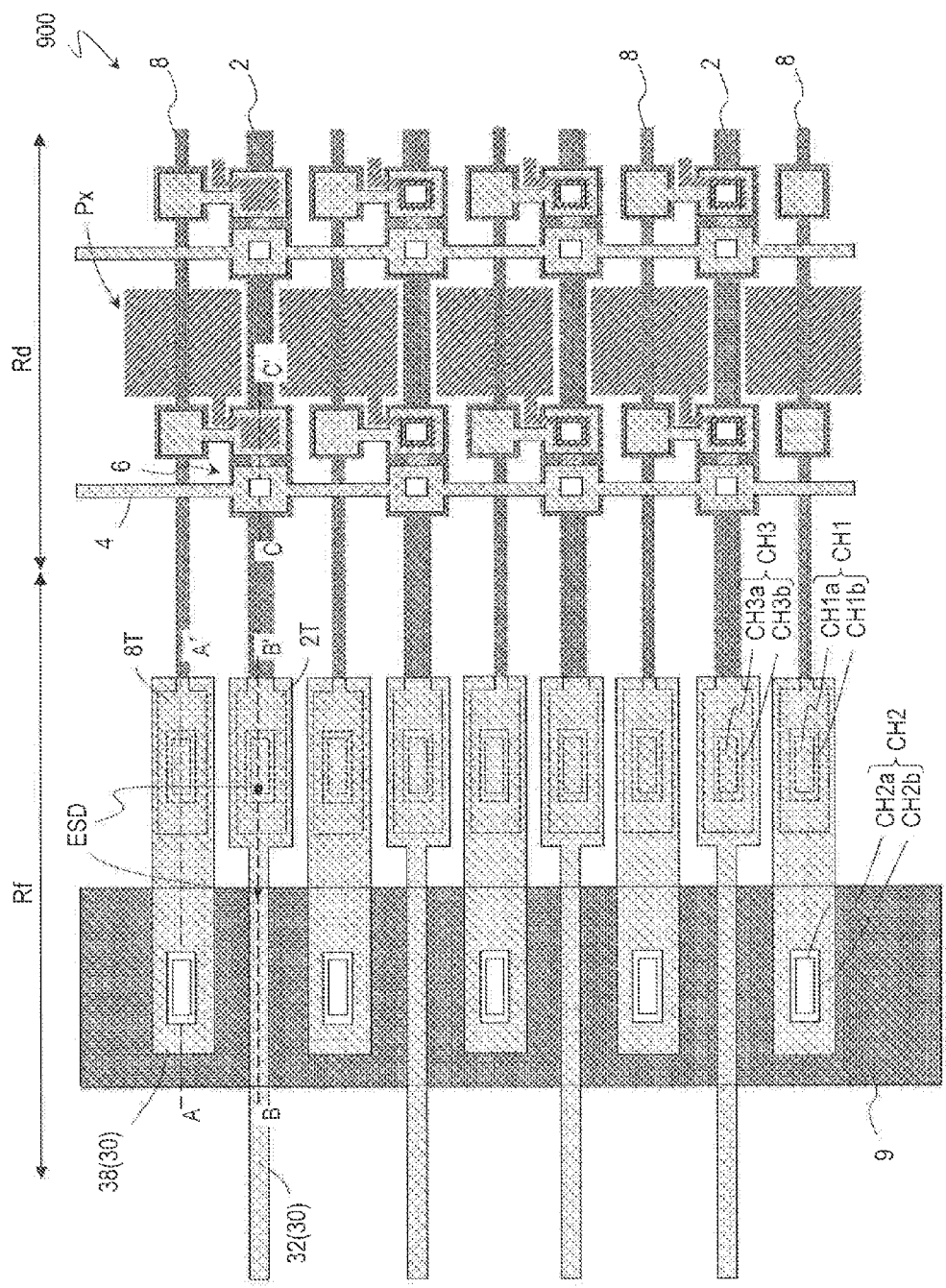
FIG. 1 A plan view showing the construction of a TFT substrate of Comparative Example 1.
Figure 2:
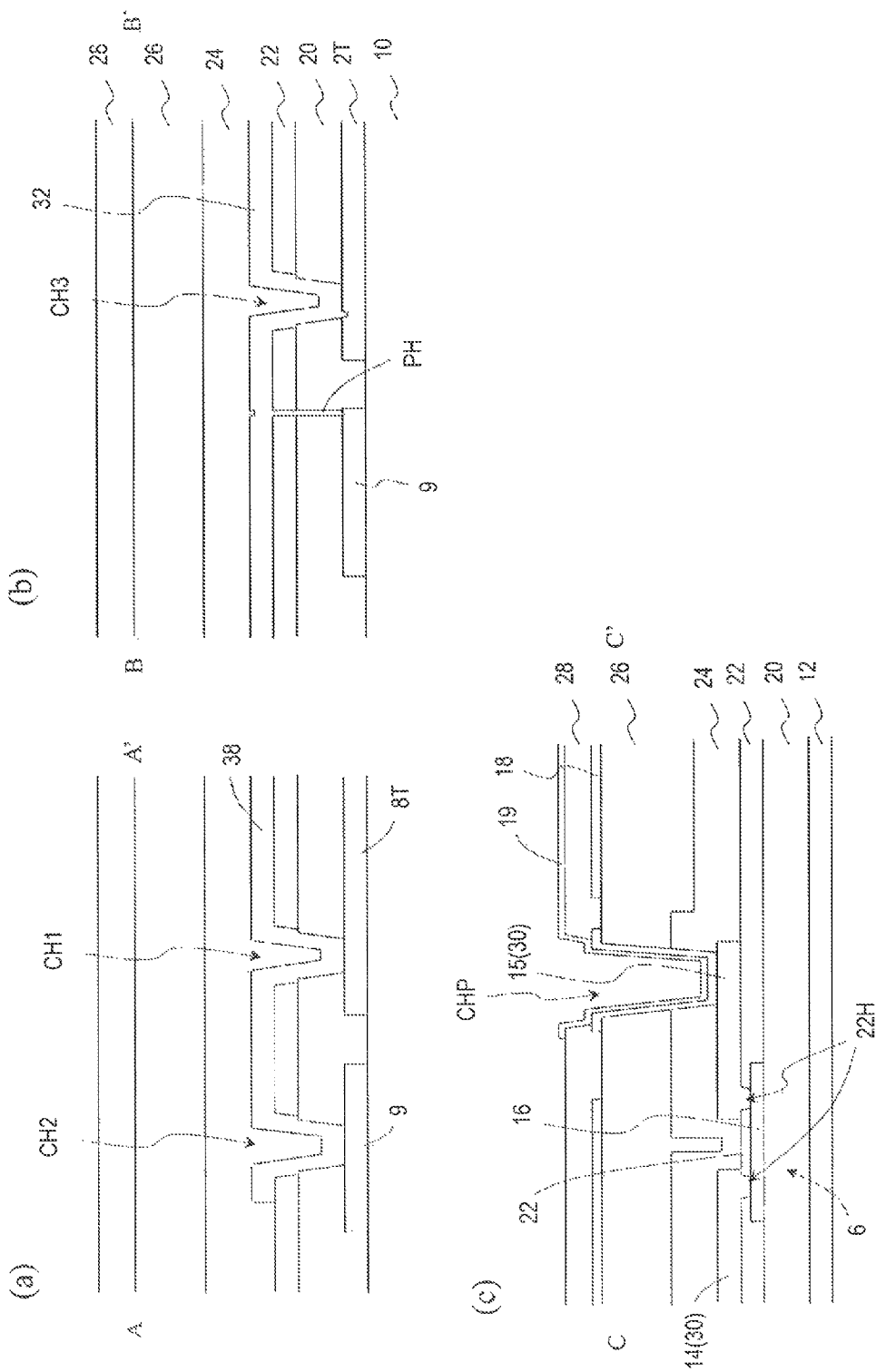
FIG. 2 (a) to (c) show cross sections taken along line A-A', line B-B', and line C-C' in FIG. 1, respectively.

FIG. 1 shows the region near the boundary between a displaying region Rd and a frame region Rf of a semiconductor device of Comparative Example 1 (which herein is a TFT substrate for use in a liquid crystal display device) 900. FIGS. 2(a) to (c) show cross sections taken along line A-A', line B-B', and line C-C' in FIG. 1, respectively.

As shown in FIG. 1, the displaying region Rd includes a plurality of pixels Px. Each pixel Px includes a TFT 6, such that a gate line 2 extending along the row direction and a source line 4 extending along the column direction are connected to the TFT 6. In the same layer as the gate lines 2, storage capacitor lines (CS lines) 8 extending in a direction which is parallel to the gate lines 2 are provided.

In the frame region Rf, a CS stem 9 that is commonly connected to plural CS lines 8 is provided on the TFT substrate 900. The CS stem 9 is formed in the same layer as the gate lines 2 and the CS lines 8. The gate lines 2, gate electrodes 12, CS lines 8, and CS stem 9 can be obtained by patterning the same electrically-conductive film. In the present specification, the layer containing them may be referred to as the "gate metal layer" or the "first electrically-conductive layer".

As shown in FIG. 2(c), a TFT 6 includes a gate electrode 12 (which herein is a portion of a gate line 2), a gate dielectric layer 20 covering the gate electrode 12, and a semiconductor layer 16 formed on the gate dielectric layer 20.

An etching stopper layer 22 is provided on the semiconductor layer 16. In the etching stopper layer 22, a pair of contact holes 22H that expose portions of the semiconductor layer 16 are provided. A source electrode 14 and a drain electrode 15 are separately provided through the pair of contact holes 22H so as to be in contact with the semiconductor layer 16. The source line 4, source electrode 14, drain electrode 15, and the like can be obtained by patterning the same electrically-conductive film. In the present specification, the layer containing them may be referred to as the "SD layer" or the "second electrically-conductive layer".

As shown in FIG. 1 and FIG. 2(b), an end portion 2T of each gate line 2 is provided in the frame region Rf of the TFT substrate 900. Above the end portion 2T of the gate line 2, a third contact hole CH3 penetrating through the etching stopper layer 22 and the gate dielectric layer 20 is formed. In the third contact hole CH3, a gate lead line 32 included in the SD layer 30 and the end portion 2T of the gate line 2 are electrically connected. The gate lead line 32 extends toward the outside of the TFT substrate 900, and is connected to a gate driver not shown, for example.

Moreover, as shown in FIG. 1 and FIG. 2(a), end portions 8T of the CS lines 8 are placed in the frame region Rf. Above the end portion 8T of each CS line 8 and above the CS stem 9, first and second contact holes CH1 and CH2 penetrating through the gate dielectric layer 20 and the etching stopper layer 22 are formed. The end portion 8T of the CS line 8 and the CS stem 9 are electrically connected to each other by a CS connection portion 38 which is connected thereto in the first and second contact holes CH1 and CH2. The CS connection portion 38 is made of the same electrically-conductive film as the source line 4 and the like, and is contained in the SD layer 30.

Note that the aforementioned first to third contact holes CH1 to CH3 are composed of openings CH1a, CH2a and CH3a that are made in the gate dielectric layer 20 and openings CH1b, CH2b and CH3b that are made in the etching stopper layer 22. In the present specification, these openings are taken together, and described as the first to third contact holes CH1 to CH3.

In this construction, as shown in FIG. 1 and FIG. 2(b), ESD may occur in the third contact hole CH3 or at an edge of the CS stem 9. As a result, a pinhole PH penetrating through the gate dielectric layer 20 and the etching stopper layer 22 occurs. As will be described later, the pinhole PH may form as ESD occurs in the step of forming (photolithography step) the first, second, and third contact holes CH1, CH2, and CH3.

If the gate lead line 32 contained in the SD layer 30 passes above where the aforementioned the pinhole PH has occurred, it becomes short-circuited with the underlying CS stem 9 through the pinhole PH. However, the gate lead line 32, which is supposed to be connected with the gate line 2, needs to be electrically insulated from the CS stem 9. Therefore, short-circuiting between the gate lead line 32 and the CS stem 9 may result in a defective condition.

Note that the TFT 6 is covered by a passivation layer 24, a planarization layer 26, and the like. Provided above these dielectric layers 24 and 26 are a common electrode 18, a pixel electrode 19 (which is connected to the drain electrode 15 via a pixel contact hole CHP), an upper dielectric layer 28 between them, and so on; however, detailed descriptions thereof are omitted.

Figure 3:
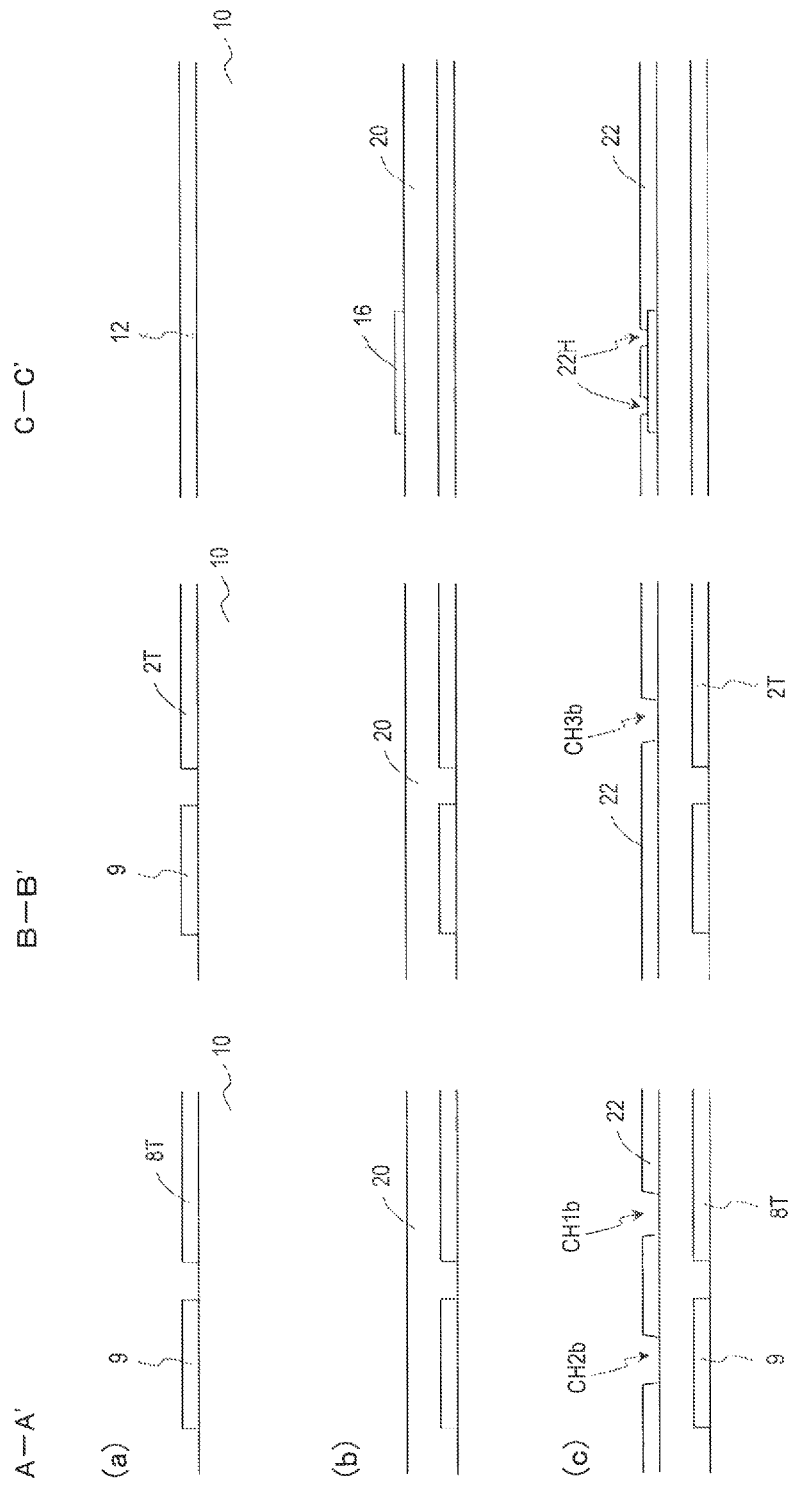
FIG. 3 Cross-sectionals view for describing production steps of the TFT substrate of Comparative Example 1, where (a) to (c) show respectively different steps.
Figure 4:
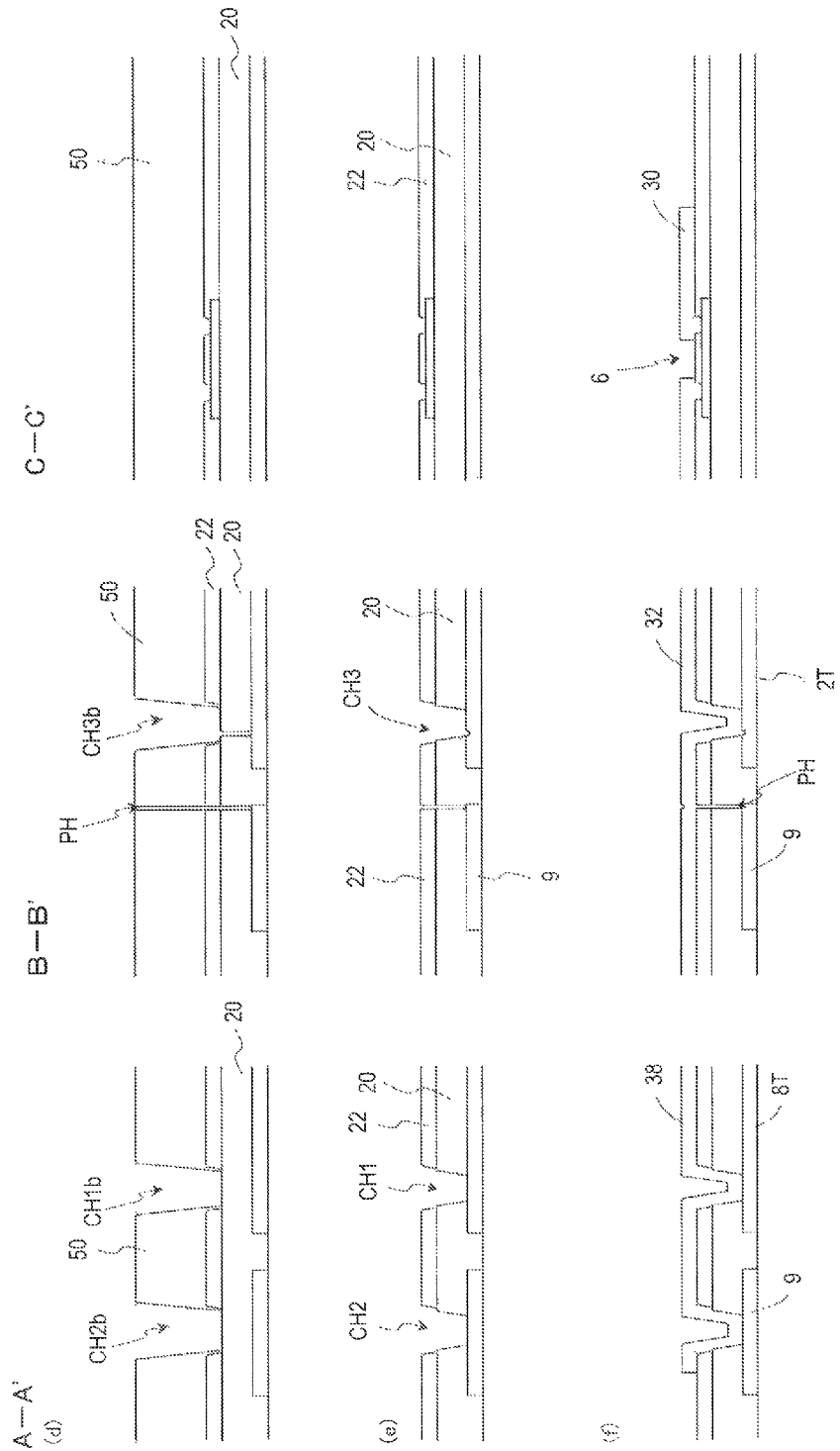
FIG. 4 Cross-sectionals view for describing production steps of the TFT substrate of Comparative Example 1, where (d) to (f) show respectively different steps.

Hereinafter, with reference to FIG. 3 and FIG. 4, production steps of the substrate 900 will be described. In FIG. 3 and FIG. 4, cross sections taken along line A-A', line B-B', and line C-C' in FIG. 1 are shown in this order from the left.

First, as shown in FIG. 3(a), on a substrate 10, a gate metal layer containing a CS stem 9, gate lines 2, and gate electrodes 12 is formed. Thereafter, as shown in FIG. 3(b), a gate dielectric layer 20 covering the gate metal layer is formed, and furthermore, a semiconductor layer 16 to form channel regions of TFTs 6 is formed.

Moreover, an etching stopper layer 22 is provided on the semiconductor layer 16 (FIG. 3(c)). In the etching stopper layer 22, pairs of contact holes 22H for achieving connection with source electrodes 14 and drain electrodes 15 are formed at positions overlapping the semiconductor layer 16.

Moreover, in the frame region Rf, as shown by an A-A' cross-sectional view (left in the figure) in FIG. 3(c), first openings CH1b are formed over end portions 8T of CS lines 8, and second openings CH2b are formed at predetermined positions overlapping the CS stem 9. Furthermore, as shown by a B-B' cross-sectional view (middle in the figure) in FIG. 3(c), third openings CH3b are formed over end portions 2T of the gate lines 2.

Although not shown, the steps of making the contact holes 22H and openings CH1b, CH2b and CH3b in the etching stopper layer 22 may be performed by a photolithography technique. In a photolithography step, an etching is performed by using a resist with openings in corresponding positions, thereby forming the aforementioned contact holes 22H and the like. In this step, ESD may occur after developing the resist.

Thereafter, as shown in FIG. 4(d), in a photolithography step for making openings in the gate dielectric layer 20, a resist 50 with openings made in positions corresponding to the openings CH1b to CH3b is formed. At this time, ESD may occur particularly in a step of developing the resist 50 provided on the dielectric layer (i.e., a step of forming an aperture pattern in the resist 50). Hereinafter, the process which causes ESD will be described more specifically.

In a photolithography step, a resist for making openings in the dielectric layer (the etching stopper layer or the gate dielectric layer 20) is applied on the substrate, and after this is exposed to light, a development step by a spin development technique or the like is performed. In this development step, a liquid such as a developer or a rinse flows on the substrate. At this time, friction occurs between the flowing liquid and the substrate to generate static electricity, whereby a charge accumulates in the gate metal layer. As a result of charge accumulation in the gate metal layer in this manner, discharge (ESD) may occur.

Moreover, in the TFT substrate 900, ESD may occur between the inside of a contact hole CH3 at the end portion 2T of a gate line 2 and a nearby edge of the CS stem 9. This is because the distance(s) between discrete conduction patterns that contained in the gate metal layer is not intentionally controlled, so that ESD may arbitrarily occur at places where the distance between conduction patterns is small or where no resist is provided.

As a result of ESD occurring in this manner, a pinhole PH penetrating through the dielectric layers 20 and 22 is formed inside the third opening CH3b, or at the edge of the CS stem 9 located near the third opening CH3b.

Thereafter, openings are made in the gate dielectric layer 20 by using the resist 50, thereby forming the first to third contact holes CH1 to CH3. After the first to third contact holes CH1 to CH3 are made, the resist 50 is removed (FIG. 4(e)). At this time, any pinhole PH that has been created at the edge of the CS stem 9 will remain as a pinhole PH reaching the CS stem 9 from the surface of the etching stopper layer 22.

Thereafter, as shown in FIG. 4(f), an SD layer (second electrically-conductive layer) 30 containing source lines 4, source electrodes 14, drain electrodes 15, and the like are formed in the dielectric layers (the gate dielectric layer 20 and the etching stopper layer 22). The SD layer 30 contains CS connection portions 38 and gate lead lines 32 to be disposed in the frame region Rf.

Each CS connection portion 38 is connected to the end portion 8T of the CS line 8 and the CS stem 9 via the first and second contact holes CH1 and CH2. Moreover, each gate lead line 32 is connected to the end portion 2T of the gate line 2 via the third contact hole CH3.

However, if a pinhole PH has occurred as mentioned above, as shown by a B-B' cross-sectional view of FIG. 4(f), short-circuiting between the gate lead line 32 and the CS stem 9 occurs at the step of forming the SD layer.

Figure 5:
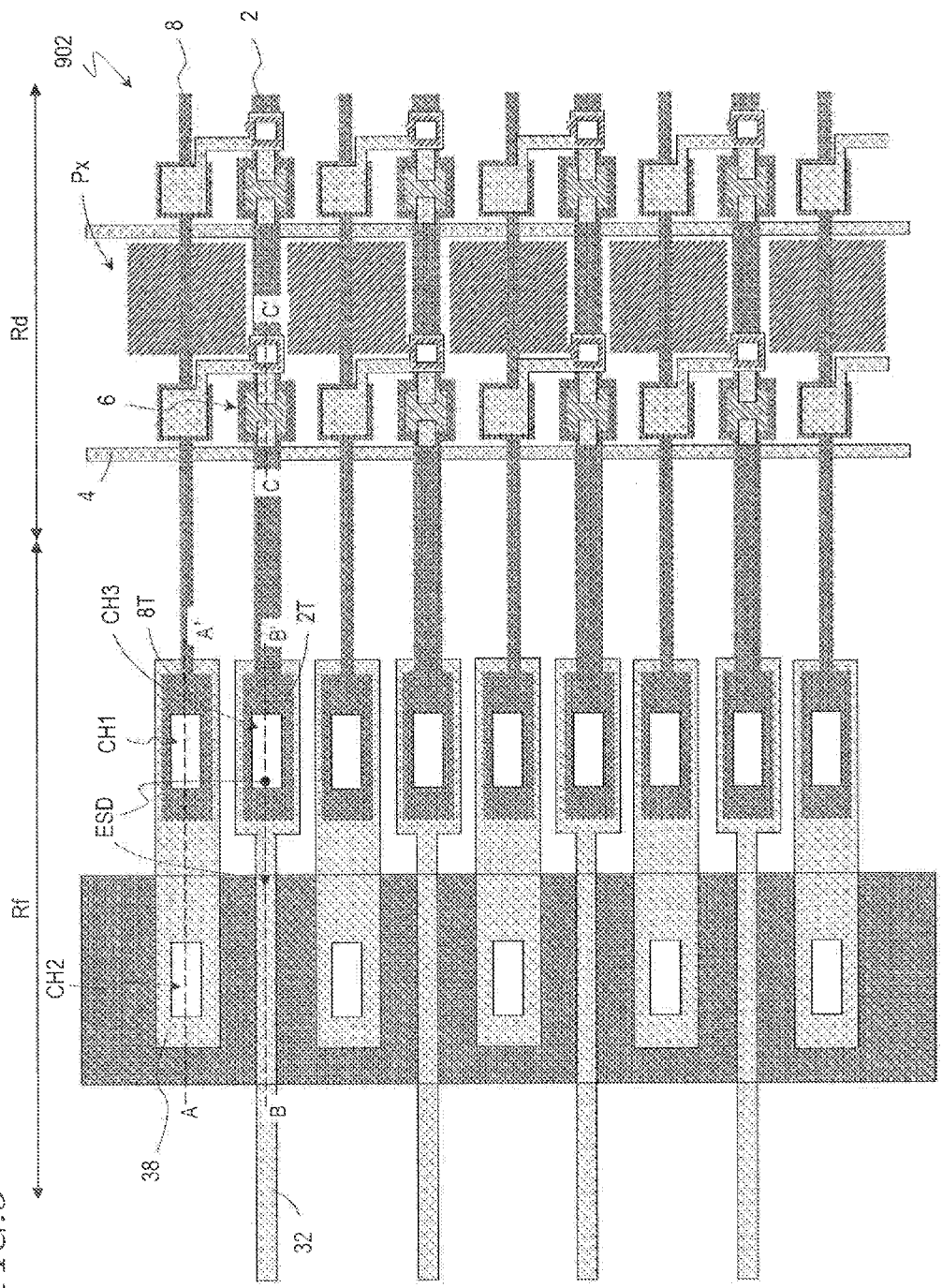
FIG. 5 A plan view showing the construction of a TFT substrate of Comparative Example 2.
Figure 6:
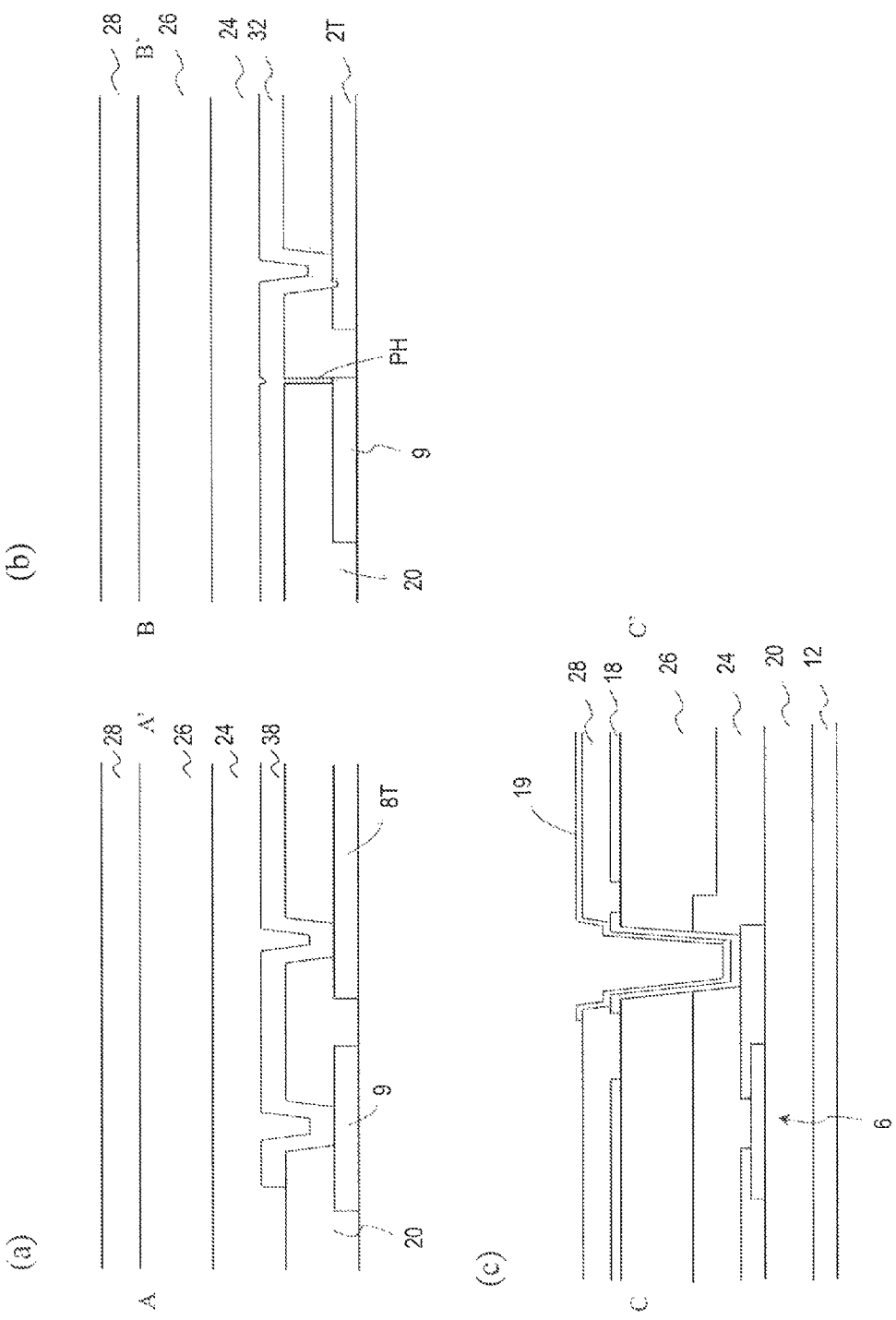
FIG. 6 (a) to (c) show cross sections taken along line A-A', line B-B', and line C-C' in FIG. 5, respectively.

Next, a TFT substrate 902 of another comparative example will be described. FIG. 5 shows a region near the boundary between a displaying region Rd and a frame region Rf of the TFT substrate 902 of Comparative Example 2. FIGS. 6(a) to (c) show cross sections taken along line A-A', line B-B', and line C-C' in FIG. 5, respectively. Furthermore, FIGS. 7(a) to (d) show a part of the production steps of the TFT substrate 902.

The TFT substrate 902 of Comparative Example 2 includes channel-etched type TFTs 6, while lacking an etching stopper layer 22 unlike the TFT substrate 900 of Comparative Example 1. However, in this construction, too, short-circuiting between the gate lead line 32 and the CS stem 9 may occur via a pinhole PH created in the gate dielectric layer 20 (FIG. 6(b)).

Hereinafter, a part of the production steps of the TFT substrate 902 will be described.

Figure 7:
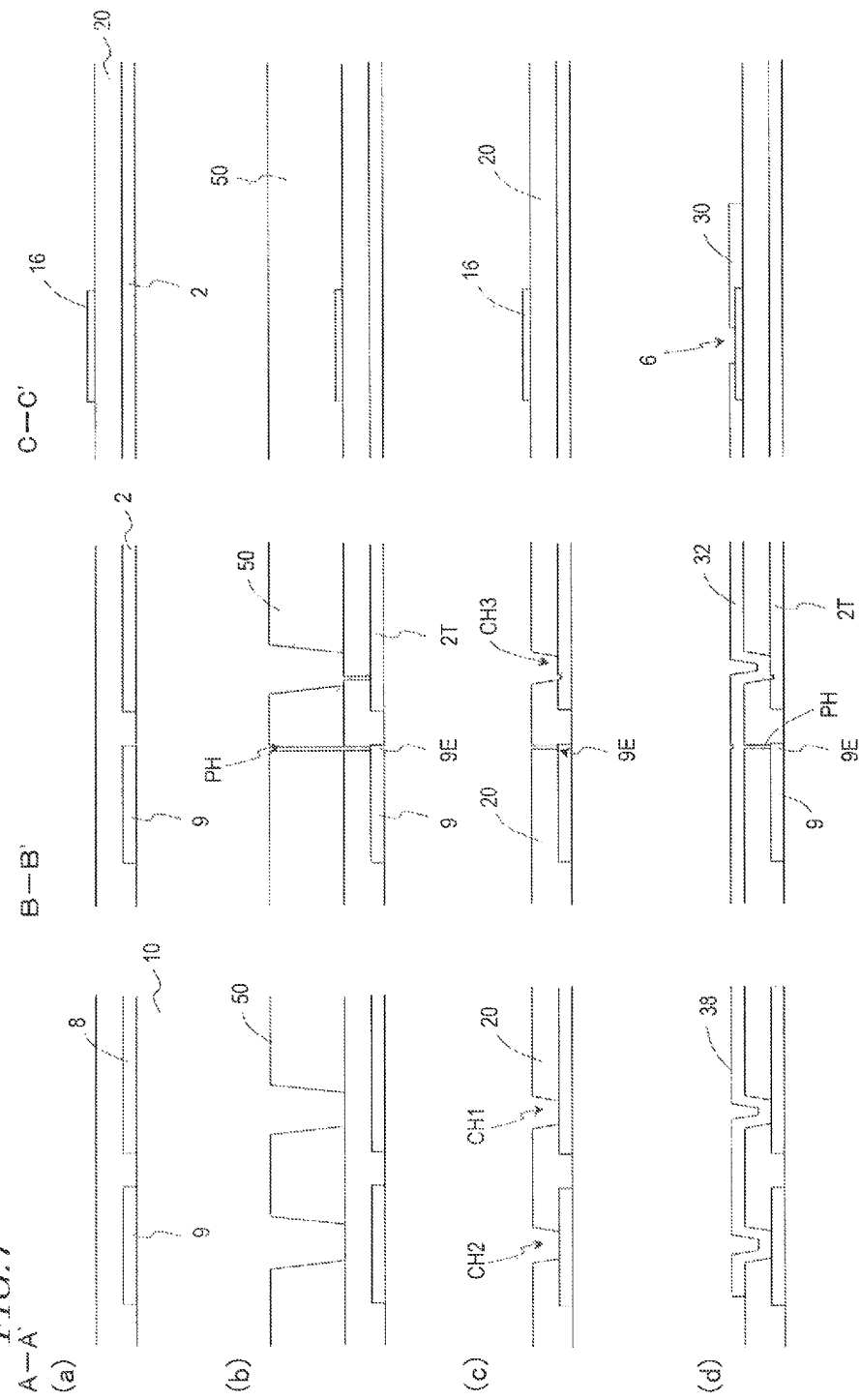
FIG. 7 Cross-sectionals view for describing production steps of the TFT substrate of Comparative Example 2, where (a) to (d) show respectively different steps.

First, as shown in FIG. 7(a), a gate metal layer (gate lines 2, CS lines 8, a CS stem 9, and the like) and a gate dielectric layer 20 covering these are provided on a substrate 10, and islands of semiconductor layer 16 from which to form TFT channels are provided further thereon.

Thereafter, as shown in FIG. 7(b), a photolithography step is performed for forming contact holes CH1 to CH3 at predetermined positions in the gate dielectric layer 20. At this step, a resist 50 with openings made in positions corresponding to the aforementioned contact holes is formed so as to cover the gate dielectric layer 20.

In a development step of the resist 50, a charge is accumulated in the gate metal layer, whereby ESD occurs. Because of the occurrence of ESD, a pinhole PH which penetrates through the gate dielectric layer 20 and reaches the gate metal layer may occur in a portion corresponding to the end portion 2T of a gate line 2 (gate line end portion 2T) or a nearby edge 9E of the CS stem 9.

Furthermore, by etching the dielectric layer exposed in the openings of the resist 50, contact holes CH1 to CH3 are formed. Thereafter, the resist 50 is removed, and an SD layer 30 covering the gate dielectric layer 20 and the semiconductor layer 16 is provided (FIGS. 7(c) and (d)).

The SD layer 30 contains a CS connection portion 38 covering the first and second contact holes CH1 and CH2, and a gate lead line 32 covering the third contact holes CH3. In the step of forming the SD layer 30, as shown by the B-B' cross-sectional view, the gate lead line 32 contained in the SD layer 30 and the edge 9E of the CS stem 9 may become short-circuited through the pinhole PH.

Figure 8:
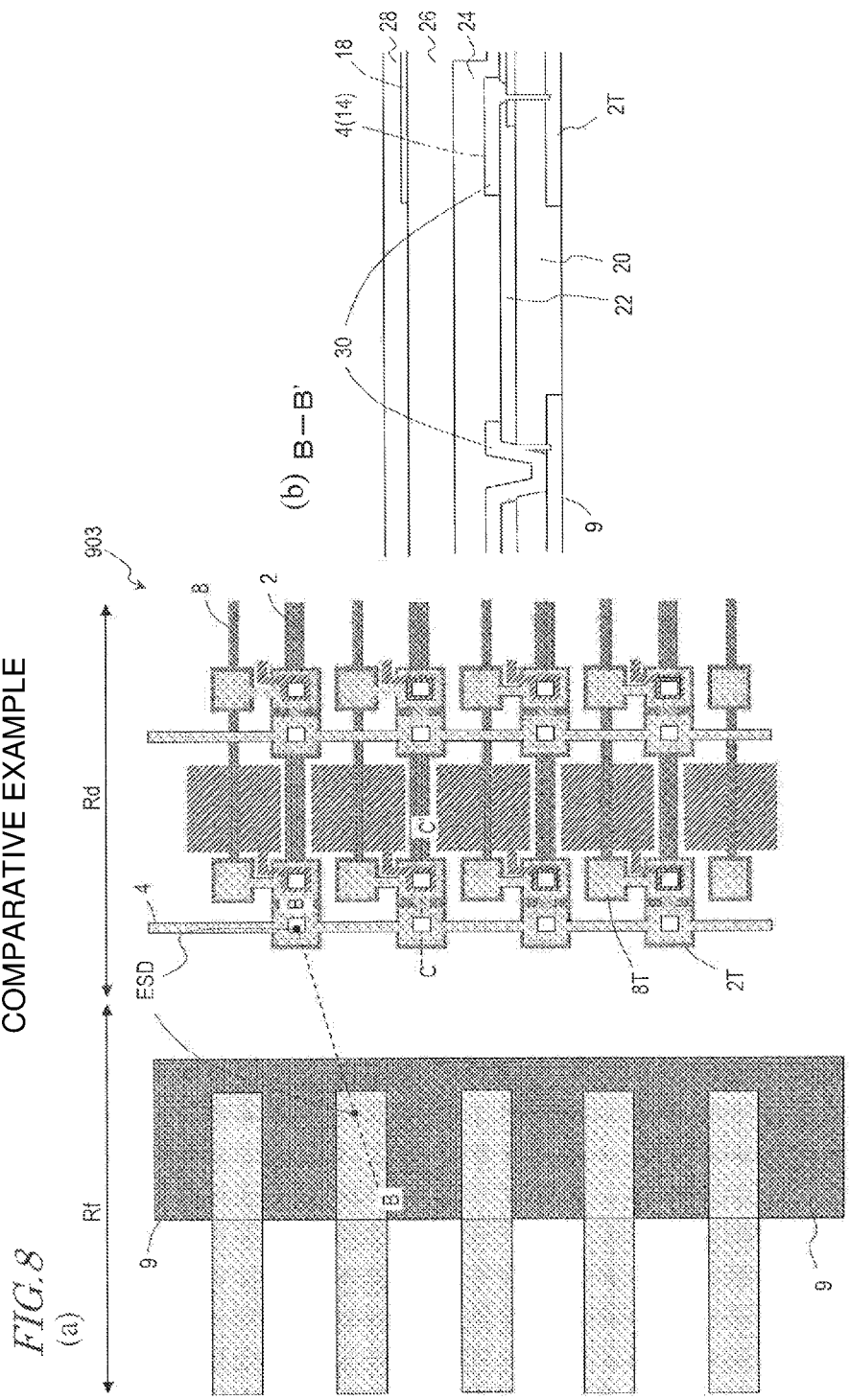
FIG. 8 (a) is a plan view showing the construction of a TFT substrate of Comparative Example 3; and (b) is a cross-sectional view taken along line B-B' in (a).

Next, a TFT substrate 903 of still another comparative example will be described. FIG. 8(a) shows a region near the boundary between a displaying region Rd and a frame region Rf of the TFT substrate 903 of Comparative Example 3, and FIG. 8(b) shows a cross section taken along line B-B' in FIG. 8(a). In the TFT substrate 903, unlike in the TFT substrates 900 and 902 of Comparative Examples 1 and 2, end portions 2T of gate lines 2 and end portions 8T of CS lines 8 are not connected to a CS stem 9 or a gate lead line.

However, in such an implementation, too, ESD may occur in the steps of providing contact holes in the etching stopper layer 22. Moreover, a pinhole which penetrates through the etching stopper layer 22 and the gate dielectric layer 20 and reaches the gate metal layer may occur. As a result, the SD layer 30 (the source line 4 or the source electrode 14 in the illustrated implementation) and the gate line 2 (end portion 2T) may become short-circuited.

As described above, ESD may possibly occur when dielectric layers such as the gate dielectric layer 20 and the etching stopper layer 22 are provided on the gate metal layer, and thereafter contact holes and the like are made in the dielectric layers 20 and 22 in a photolithography step. This ESD may create a pinhole reaching the gate metal layer. If a pinhole has thus been created, conduction may occur between the SD layer and the gate metal layer via the pinhole during subsequent formation of the SD layer.

At any site where the SD layer and the gate metal layer are meant to be connected, defective conditions will not arise even if a pinhole occurs. However, when a pinhole is created at a site where the SD layer and the gate metal layer need to be insulated from each other, e.g., under a gate lead line 32 (SD layer) provided so as to overlap the CS stem 9 (gate metal layer), short-circuiting will cause defective conditions (insufficient connection).

Therefore, it would be advantageous to adopt a construction which appropriately controls sites of ESD occurrence, and prevents problems even if a pinhole penetrating through a dielectric layer is created. In particular, if positions at which discharge primarily occurs can be controlled without significantly changing the conventional fabrication process, it is possible to increase the production yield while suppressing increase in the production cost.

According to an embodiment of the present invention, a site to promote ESD is provided between two conduction patterns which are arranged to be connected with each other. More specifically, between two isolated conduction patterns contained in a first electrically-conductive layer (e.g., a gate metal layer), a portion (protruding portion) which is proximate relative to other portions is provided. Furthermore, a hole which typically penetrates through a dielectric layer is provided so as to at least partially overlap this proximate portion. This construction allows the sites of ESD occurrence to be controlled, thereby preventing insufficient connection from occurring even when pinholes are created in the dielectric layer.

Hereinafter, semiconductor devices according to embodiments of the present invention will be described. Note that semiconductor devices according to embodiments of the present invention broadly encompass active matrix substrates, various display devices, electronic devices and the like.

Embodiment 1

Figure 9:
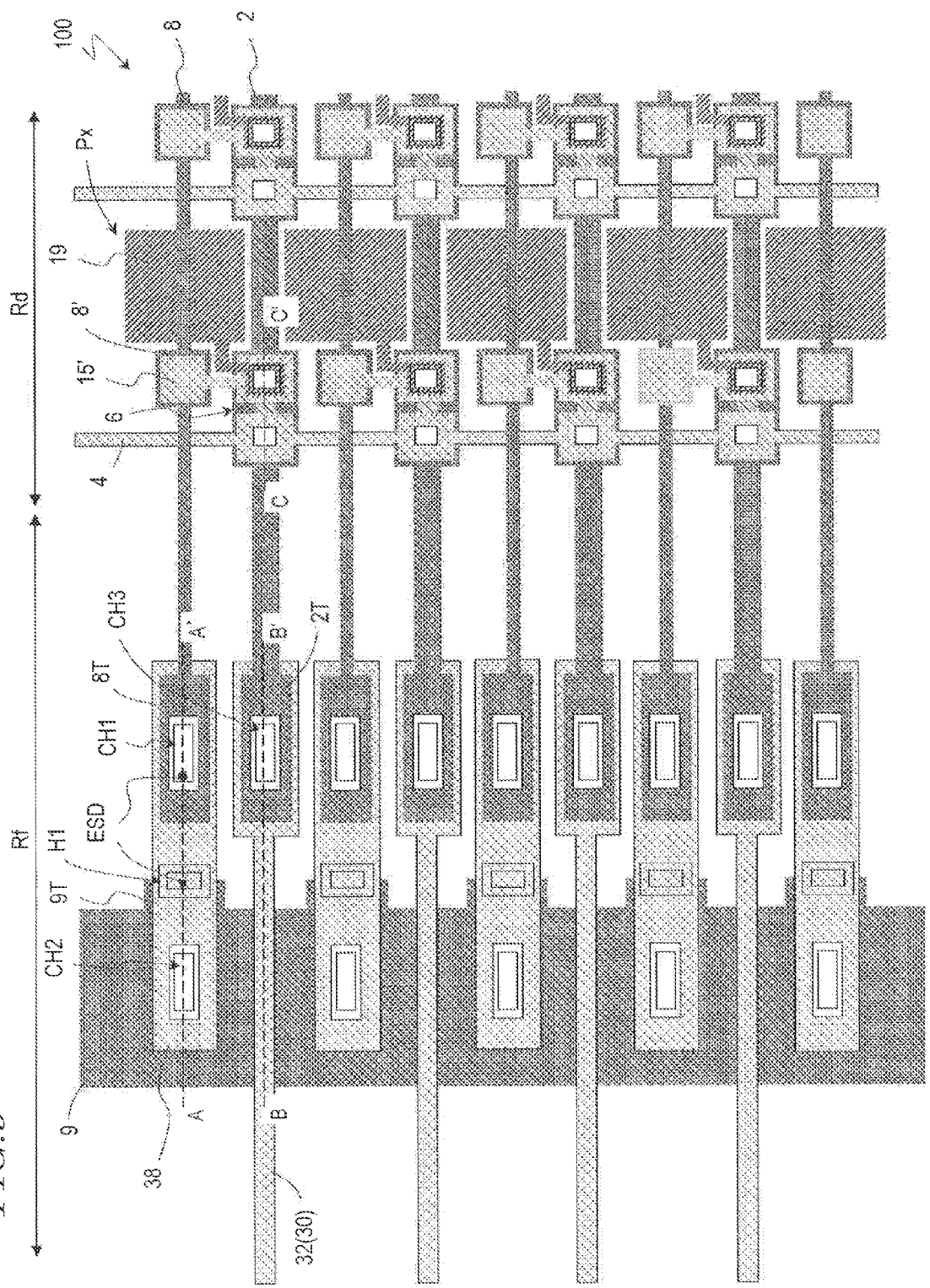
FIG. 9 A plan view showing the construction of a TFT substrate according to Embodiment 1 of the present invention.

FIG. 9 and FIGS. 10(a) to (c) show a semiconductor device 100 according to Embodiment 1. Herein, the semiconductor device 100 is a TFT substrate (active matrix substrate) 100 for use in a liquid crystal display device. FIG. 9 shows a planar structure of the TFT substrate 100 in the region near the boundary between a displaying region Rd and a frame region Rf, whereas FIGS. 10(a) to (c) show cross sections taken along line A-A', line B-B', line C-C' in FIG. 9, respectively.

As shown in FIG. 9, the TFT substrate 100 has a displaying region Rd, and a peripheral region (frame region) Rf located outside the displaying region Rd.

In the displaying region Rd, a plurality of pixels Px are provided in a matrix shape (however, FIG. 9 only shows the pixels in the leftmost column). Each pixel Px includes a TFT 6 as an active element. Moreover, the TFT 6 has a gate line 2 extending along the row direction and a source line 4 extending along the column direction connected thereto. Moreover, in the TFT substrate 100, storage capacitor lines (CS lines) 8 extending substantially parallel to the gate lines 2 are provided so as to traverse the pixels Px.

As shown in FIG. 10(c), each TFT 6 includes a gate electrode 12 (which in the present embodiment is a portion of a gate line 2), a gate dielectric layer 20 covering the gate electrode 12, and a semiconductor layer 16 formed on the gate dielectric layer 20. Moreover, an etching stopper layer 22 is provided on the semiconductor layer 16. A pair of contact holes 22H that expose the semiconductor layer 16 are made in the etching stopper layer 22. Via the contact holes 22H, a source electrode 14 and a drain electrode 15 are connected with the semiconductor layer 16.

Thus, in the TFT 6, a channel-forming region in the semiconductor layer 16 is covered by the etching stopper layer 22. Such a TFT 6 is sometimes called a channel-protection type TFT.

Note that an oxide semiconductor layer may be used as the semiconductor layer 16, in which case it is particularly preferable to suppress etching damage to the region to become a channel of each TFT 6 with the etching stopper layer 22, in order to prevent deteriorations in the element characteristics. However, in the case where the etching stopper layer 22 is provided and contact holes 22H for achieving connection with the oxide semiconductor layer are made in the etching stopper layer 22 (that is, a channel-protection type TFT is formed), as will be described later, ESD is likely to occur. A semiconductor device according to an embodiment of the present invention is constructed in a manner of accounting for such ESD, and is suitably used as a semiconductor device including channel-protection type TFTs in which an oxide semiconductor is used as the semiconductor layer, for example.

In the frame region Rf, on the other hand, end portions 8T of the CS lines 8 (CS line end portions 8T) and end portions 2T of the gate lines 2 (gate line end portions 2T) are provided. Moreover, with a gap from the end portions 8T and 2T, a CS stem (storage capacitor stem line) 9 contained in the gate metal layer is provided. The CS stem 9 extends along the column direction, which is a substantially orthogonal direction to the direction that the gate lines 2 and the CS lines 8 extend (i.e., a substantially parallel direction to the direction that the source lines 4 extend). The CS stem 9 is relatively thick in width, and has a relatively large geometric area.

Among the edges of the CS stem 9 in the TFT substrate 100, the edge that opposes the CS line end portions 8T and the gate line end portions 2T has portions 9T protruding toward the CS line end portions 8T formed thereto. This makes the distance between the CS stem 9 and each CS line end portion 8T shorter than the distance between the CS stem 9 and each gate line end portion 2T. The protruding portions 9T of the CS stem 9 are portions which are proximate to the CS line end portions 8T. In the present specification, such portions 9T may be referred to as proximate portions 9T of the CS stem 9.

Note that the proximate portions 9T may be formed by creating notches in the other portions. The proximate portions 9T which has been formed in this manner will be proximate to the CS line end portions 8T relative to the notched portions.

Figure 10:
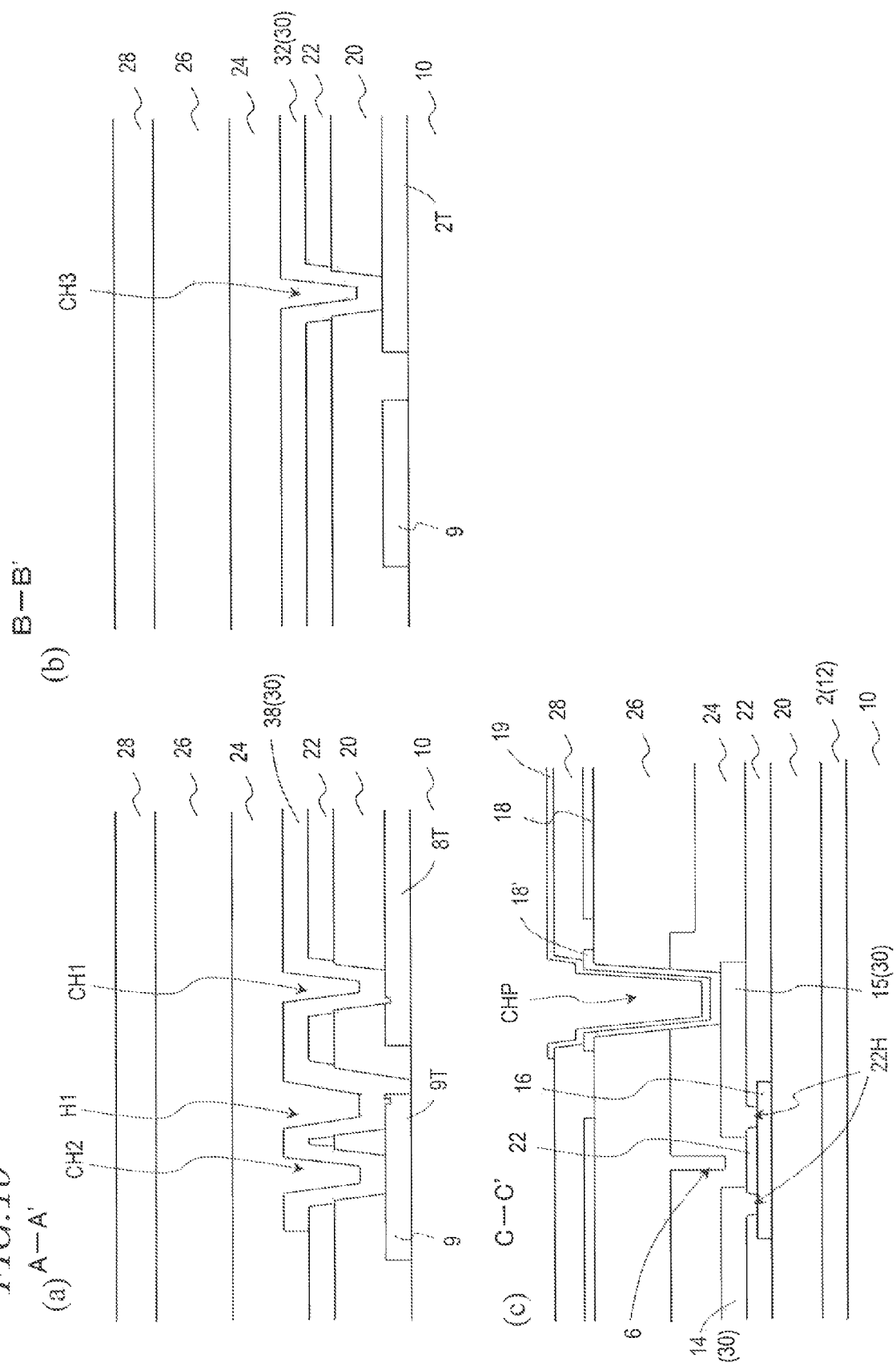
FIG. 10 (a) to (c) show cross sections taken along line A-A', line B-B', and line C-C' in FIG. 9, respectively.

Moreover, as shown in FIG. 9 and FIG. 10(*a*), a first contact hole CH1 penetrating through the gate dielectric layer 20 and the etching stopper layer 22 is provided at the end portion 8T of each CS line 8. As will be described later, the first contact hole CH1 is created by a process of making an opening CH1*b* in the etching stopper layer 22 and a process of making an opening CH1*a* in the gate dielectric layer 20 within this opening.

When the openings CH1*a* and CH1*b* differ in size, a hole having a stepped side face will be created. In the present specification, any such hole will be described as a single contact hole penetrating through plural dielectric layers. In other words, a contact hole may be composed of openings which are respectively formed in plural stacked dielectric layers, and its aperture and cross-sectional shape may vary in discontinuous manners part of the way along the depth direction.

Moreover, second contact holes CH2 are formed in the central portion of the CS stem 9. The contact holes CH2 are also formed so as to penetrate through the gate dielectric layer 20 and the etching stopper layer 22.

Each first contact hole CH1 and each second contact hole CH2 are disposed along a direction that the CS line 8 extends. Typically, the first contact hole CH1 and second contact hole CH2 are both located on an imaginary straight line extending along the CS line 8 (hereinafter referred to as an extension of the CS line 8).

Furthermore, above each proximate portion 9T of the CS stem 9, a first hole H1 at least partially overlapping the proximate portion 9T is provided. In the present embodiment, the first holes H1 too are formed so as to penetrate through the gate dielectric layer 20 and the etching stopper layer 22. In other words, the first holes H1 are provided so as to expose the surface of the proximate portions 9T. Moreover, similarly to the first and second contact holes CH1 and CH2, each first hole H1 is also located on an extension of the CS line 8. Note that, herein, the first holes H1 are throughholes reaching the gate metal layer that are made in a similar step to those for the first and second contact holes CH1 and CH2.

Each first contact hole CH1 and each second contact hole CH2 are integrally covered by a CS connection portion 38 provided in the SD layer 30. The CS end portion 8T and the CS stem 9 are electrically connected by the CS connection portion 38, through the first contact hole CH1 and second contact hole CH2. Furthermore, the CS connection portion 38 also covers the first hole H1, and the proximate portion 9T too is electrically connected to the CS end portion 8T.

Moreover, as shown in FIG. 10(*b*), a third contact hole CH3 penetrating through the gate dielectric layer 20 and the etching stopper layer 22 is made above the gate end portion 2T. In the SD layer 30, a gate lead line 32 is provided so as to extend from each third contact hole CH3 toward the outside of the TFT substrate 100.

The gate lead line 32 is connected to the gate line end portion 2T via the third contact hole CH3. Moreover, the gate lead line 32 extends along the row direction so as to intersect the CS stem 9, with its tip being connected to a gate driver (not shown). However, the gate lead line 32 and the CS stem 9 are insulated from each other by the gate dielectric layer 20 and the etching stopper layer 22.

In a manner of covering the SD layer 30, two dielectric layers, i.e., a passivation layer 24 and a planarization layer 26, are provided. The passivation layer 24 is made of an inorganic insulating film such as an $SiO_2$ film, for example, and is used for protecting the TFTs 6 among other purposes. The planarization layer 26 is made of a photosensitive organic insulating film, for example, and is used for planarizing the surface of the substrate among other purposes.

A common electrode 18 is provided on the planarization layer 26. Moreover, an upper dielectric layer 28 is provided on the common electrode 18. On the upper dielectric layer 28, a pixel electrode layer including a plurality of pixel electrodes 19 that are provided for the respective pixels Px is provided. Each pixel electrode 19 is connected to the drain electrode 15 of the TFT 6 via a contact hole (which may be referred to as a pixel contact hole) CHP that penetrates through the passivation layer 24, the planarization layer 26, and the upper dielectric layer 28.

The common electrode 18 and the pixel electrodes 19 are made of a transparent electrically-conductive material such as ITO, for example. The common electrode 18 is provided on the planarization layer 26, and is insulated from the pixel electrodes 19 and the drain electrodes 15 of the TFTs 6. For this reason, the common electrode 18 typically has openings whose edges are outside the pixel contact holes CHP. Moreover, in each pixel contact hole CHP, a connecting portion 18' may be provided, which is made through the same step as the common electrode 18. The connecting portion 18' is disposed between the pixel electrode 19 and the drain electrode 15, and used for interconnecting them.

Note that each pixel electrode 19 and the common electrode 18 may be placed so as to oppose each other via the upper dielectric layer 28 to create a storage capacitor. In the case where the TFT substrate 100 is applied to a liquid crystal display device of the FFS (Fringe Field Switching) mode, the pixel electrode 19 and the common electrode 18 may be arranged so that an oblique electric field is generated therebetween. In the case of a TFT substrate which is applied to an FFS mode liquid crystal display device, a plurality of slits or a plurality of elongated electrode portions are provided in either the pixel electrode 19 or the common electrode 18.

Moreover, as shown in FIG. 9, a storage capacitor electrode 8' is connected to the CS line 8 at each pixel Px, and a storage capacitor counter electrode 15' extending from the drain electrode 15 is provided. The storage capacitor electrode 8' and the storage capacitor counter electrode 15' are placed so as to oppose each other via a dielectric layer such as the gate dielectric layer 20, such that they create a storage capacitor.

Note that the above construction is only an example; it will be appreciated that the TFT substrate according to an embodiment of the present invention may be of various other implementations. For example, in other embodiments, e.g., a TFT substrate for use in a liquid crystal display device of the vertical field mode, the upper dielectric layer 28 and the common electrode 18 need not be provided.

In the TFT substrate 100 constructed as above, ESD is likely to occur at positions corresponding to the first contact holes CH1 made above the CS line end portions 8T and positions corresponding to the first holes H1 made above the proximate portions 9T of the CS stem 9 (both of which are positions where the resist 50 has openings). When ESD occurs at these sites, even if pinholes penetrating the dielectric layer are created, defective conditions are prevented because the CS connection portions 38 are meant to be connected to the CS line end portions 8T and the CS stem 9.

By controlling sites of ESD occurrence in this manner to prevent short-circuiting between the gate lead lines 32 and the CS stem 9, defective conditions can be suppressed.

Hereinafter, with reference to FIG. 11 to FIG. 13, a method of producing the TFT substrate 100 will be described.

Figure 11:
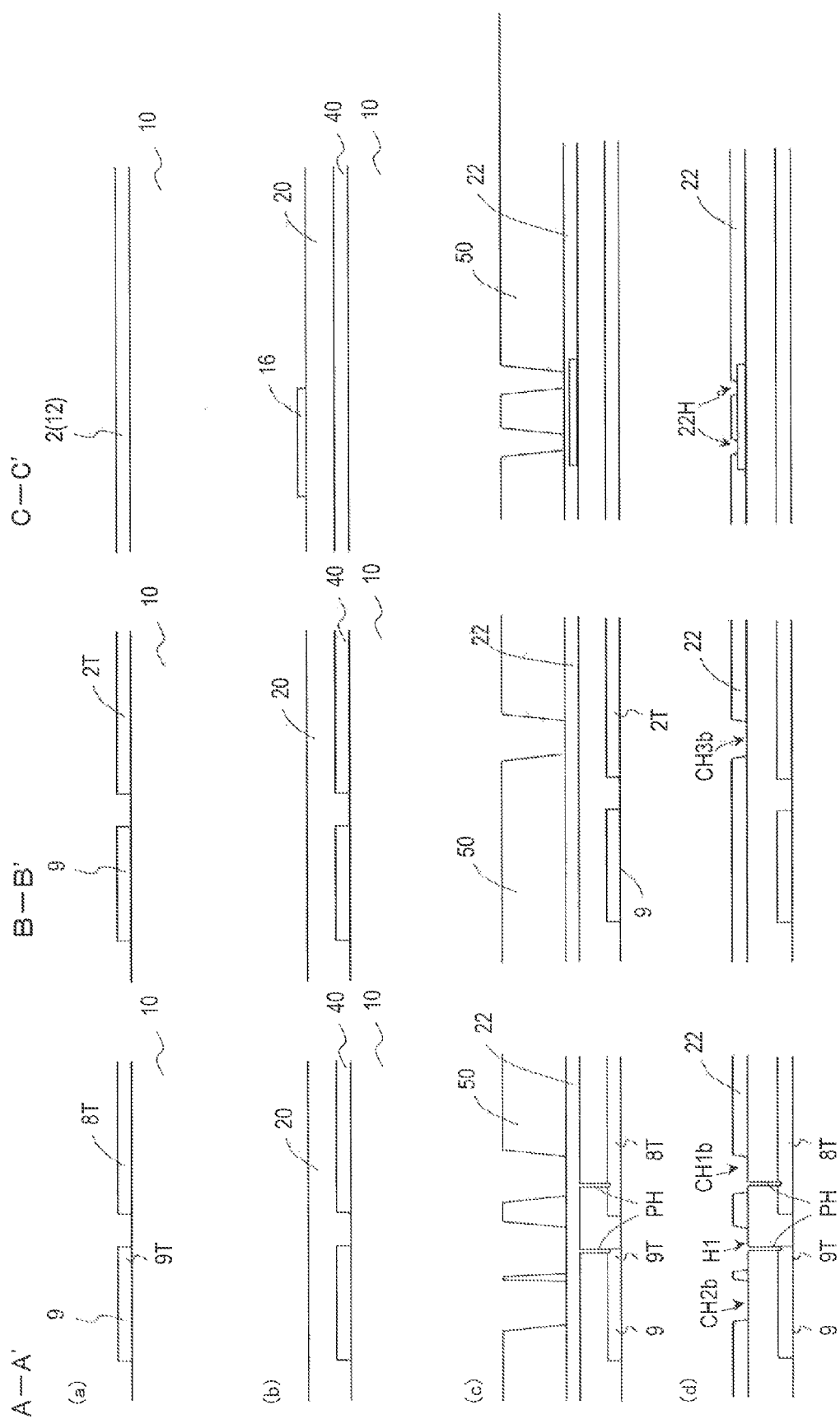
FIG. 11 Cross-sectionals view for describing production steps of the TFT substrate of Example 1, where (a) to (d) show respectively different steps.

First, as shown in FIG. 11(*a*), on a transparent substrate 10 made of glass, plastic, or the like, a gate metal layer containing gate line end portions 2T, CS line end portions 8T, a CS stem 9, and the like is formed. The gate metal layer is obtained by patterning a metal multilayer film of MoNb (thickness: 30 to 150 nm)/Al (thickness: 100 to 400 nm), for example. Note that the denotation MoNb/Al indicates that an MoNb layer and an Al layer are stacked in this order from the upper layer. In the present specification, similar denotations may also be adopted for other multilayer structures.

Thereafter, as shown in FIG. 11(*b*), a gate dielectric layer 20 covering the gate metal layer 40 is formed. The gate dielectric layer 20 may have a multilayer structure of $SiO_2$ (thickness: 30 to 300 nm)/$SiN_x$ (thickness: 100 to 400 nm), for example.

Moreover, on the gate dielectric layer 20, a semiconductor layer 16 typically in island-like planar shapes is provided. The semiconductor layer 16 is made of an oxide semiconductor having a thickness of 30 to 150 nm, for example.

More specifically, the semiconductor layer 16 may be made of an In—Ga—Zn—O type semiconductor, for example. Herein, the In—Ga—Zn—O type semiconductor is a ternary oxide of In (indium), Ga (gallium), and Zn (zinc). The proportion between In, Ga, and Zn (composition ratio) is not particularly limited, and may be In:Ga:Zn=2:2:1, In:Ga:Zn=1:1:1, In:Ga:Zn=1:1:2, etc., for example. Moreover, the In—Ga—Zn—O type semiconductor may be amorphous or crystalline. As a crystalline In—Ga—Zn—O type semiconductor, those crystalline In—Ga—Zn—O type semiconductors whose c axis is aligned essentially perpendicular to the layer plane are preferable. The crystal structure of such an In—Ga—Zn—O type semiconductor is disclosed in Japanese Laid-Open Patent Publication No. 2012-134475, for example. The entire disclosure of Japanese Laid-Open Patent Publication No. 2012-134475 is incorporated herein by reference.

A TFT having an In—Ga—Zn—O type semiconductor layer (hereinafter referred to as an "IGZO_TFT") has a high mobility (more than 20 times that of an a-Si TFT) and a low leak current (less than 1/100 of that of an a-Si TFT), and is suitably used as a driving TFT or a pixel TFT. Using an IGZO_TFT makes it possible to significantly reduce power consumption of a display device.

The oxide semiconductor layer is not limited to an In—Ga—Zn—O type semiconductor layer. The oxide semiconductor layer may contain, for example, a Zn—O type semiconductor (ZnO), an In—Zn—O type semiconductor (IZO), a Zn—Ti—O type semiconductor (ZTO), a Cd—Ge—O type semiconductor, a Cd—Pb—O type semiconductor, an In—Sn—Zn—O type semiconductor (e.g., $In_2O_3$—$SnO_2$—ZnO), an In—Ga—Sn—O type semiconductor, or the like.

Next, after the semiconductor layer 16 is formed, an etching stopper layer 22 is formed as shown in FIGS. 11(*c*) and (*d*). The etching stopper layer 22 can be formed by patterning an $SiO_2$ film having a thickness of 100 to 300 nm, for example.

Within each pixel Px, a pair of contact holes 22H that expose the semiconductor layer 16 are formed in the etching stopper layer 22. However, various implementations are possible other than providing the contact holes 22H, so long as the etching stopper layer 22 exposes a part or a whole of the semiconductor layer 16 except for the channel region. For example, the etching stopper layer 22 may only cover the central portion (channel region) of the semiconductor layer 16.

In the frame region Rf, openings CH1*b* are formed in the etching stopper layer 22 above the CS line end portions 8T, and openings CH2*b* are formed above the central portion of the CS stem 9 located on the extensions of the CS lines. Furthermore, openings CH3*b* are formed above the gate line end portions 2T.

Moreover, in the present embodiment, first holes H1 are formed in the etching stopper layer 22 above the proximate portions 9T of the CS stem 9.

In a photolithography step for forming the etching stopper layer 22, as shown in FIG. 11(*c*), a resist 50 with openings at predetermined positions is formed. The resist 50 is obtained by applying a resist material on the substrate, exposing it to light by using a mask, followed by development. In the development step, as a developer or a rinse flows on the substrate, etc., a charge is stored in the gate metal layer, thereby causing ESD. Because of the occurrence of ESD, pinholes PH are created in the gate dielectric film 20.

As shown by the A-A' cross-sectional views in FIGS. 11(*c*) and (*d*), ESD and pinholes PH primarily occur in the portions of the CS line end portions 8T that are not covered by the resist 50 as well as the proximate portions 9T of the CS stem 9 opposing them. The reasons are that the distances between the proximate portions 9T of the CS stem 9 and the CS line end portions 8T are relatively small, and that the CS line end portions 8T are located in the openings of the resist 50.

Figure 12:
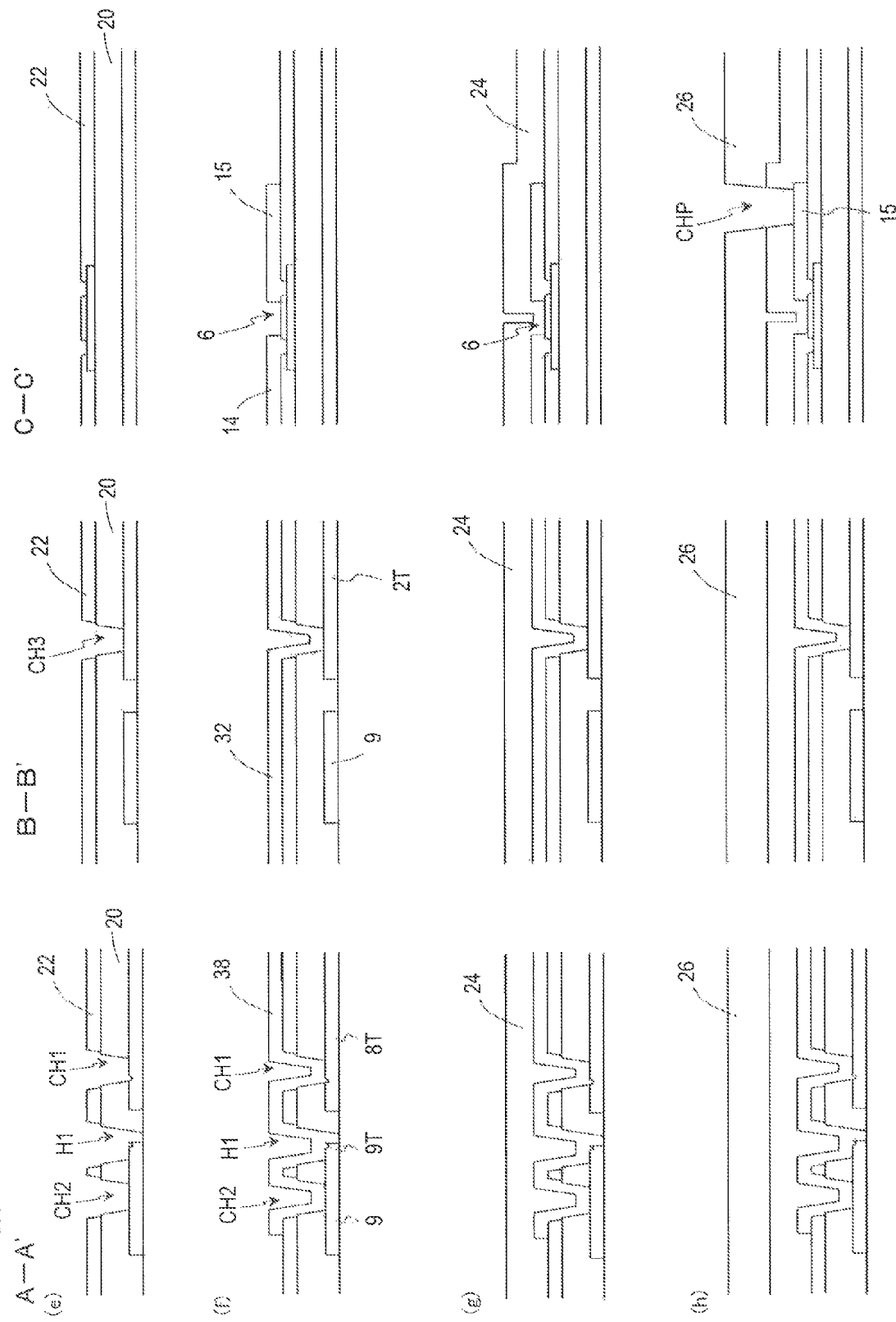
FIG. 12 Cross-sectionals view for describing production steps of the TFT substrate of Example 1, where (e) to (h) show respectively different steps.
Figure 13:
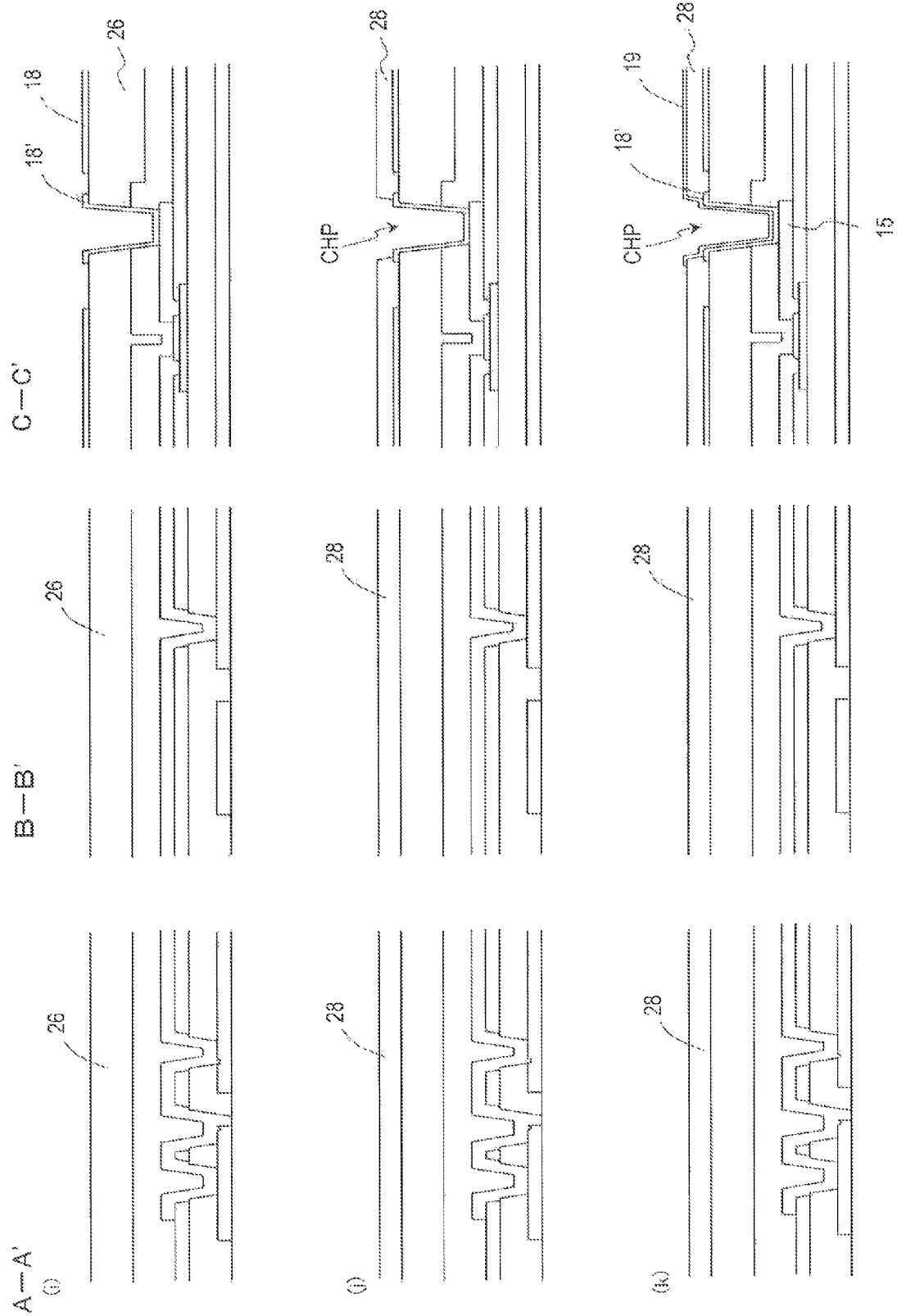
FIG. 13 Cross-sectionals view for describing production steps of the TFT substrate of Example 1, where (i) to (k) show respectively different steps.

Thereafter, as shown in FIG. 12(*e*), a process of forming openings in the gate dielectric layer 20 at positions corresponding to the openings in the etching stopper layer 22 is performed by using a photolithography technique. As a result, the first to third contact holes CH1, CH2, CH3 and first holes H1 that expose the gate metal layer are completed. After these openings are formed, the resist is removed off the substrate.

In this step, too, a resist (not shown) with openings may be provided on the etching stopper layer 22, and ESD may occur in a development step of the resist or the like. Moreover, with occurrence of ESD, pinholes reaching the gate metal layer may be created in the gate dielectric layer 20 or the like.

Thereafter, as shown in FIG. 12(*f*), a step of forming an SD layer is performed. In the displaying region Rd, the SD layer contains source lines 4, source electrodes 14, drain electrodes 15, CS counter electrodes 15', etc. In the frame region Rf, the SD layer contains gate lead lines 32, CS connection portions 38, etc. As the source electrodes and drain electrodes 15 are formed, the TFTs 6 are completed.

In this step, at the CS stem proximate portions 9T (first holes H1) and the CS line end portions 8T (first contact holes CH1), which are sites of ESD occurrence, CS connection portions 38 are formed so as to be in contact with the CS stem 9 and the CS line end portions 8T. However, these portions are meant to be connected with each other via the CS connection portions 38. Therefore, even if ESD occurs, unwanted short-circuiting will not occur, and defective conditions will be prevented.

Note that the SD layer can be obtained by patterning a metal multilayer film of MoNb (thickness: e.g. 100 nm)/Al (thickness: e.g. 200 nm)/MoNb (thickness: e.g. 100 nm). In this step, the source electrodes 14 and the drain electrodes 15 are formed by etching the metal film. Since the etching stopper layer 22 that includes portions covering the channel regions of the semiconductor layer 16 is formed under the metal film, damage due to etching is prevented from acting on the semiconductor layer 16.

In particular, when the semiconductor layer 16 is made of an oxide semiconductor layer, the presence of the etching stopper layer 22 effectively prevents deteriorations in the element characteristics of the TFT 6. Also, when an oxide semiconductor layer is used, the etching stopper layer 22 may be composed of an oxide (e.g., $SiO_2$), whereby hydrogen diffusion from the passivation layer 24 into the oxide semiconductor layer can be suppressed, so that oxygen defects in the oxide semiconductor layer can be prevented.

Thereafter, as shown in FIG. 12(g), a passivation layer 24 is provided so as to cover the TFT 6. The passivation layer 24 may be an $SiO_2$ film having a thickness of 50 to 500 nm, an $SiN_x$ film having a thickness of 50 to 500 nm, or an $SiN_x$ (thickness: 50 to 400 nm)/$SiO_2$ (thickness: 50 to 400 nm) film, for example.

Thereafter, as shown in FIG. 12(h), a planarization layer 26 (thickness: 1.5 to 3.5 μm) made of a photosensitive transparent organic insulating film or the like is provided. Moreover, after the planarization layer 26 is formed, openings for achieving connection with the drain electrodes 15 (constituting pixel contact holes CHP) are provided so as to penetrate through the passivation layer 24 and the planarization layer 26.

Furthermore, as shown in FIGS. 13(i) and (j), a common electrode 18 and connecting portions 18' made of ITO (indium tin oxide), IZO (indium zinc oxide), or the like is formed on the planarization layer 26, upon which an upper dielectric layer 28 is further formed. Openings for achieving connection with the drain electrodes 15 are also formed in the upper dielectric layer 28, whereby the pixel contact holes CHP are obtained.

Furthermore, as shown in FIG. 13(k), pixel electrodes 19 are provided on the upper dielectric layer 28. The pixel electrodes 19 are connected to the drain electrodes 15 via the connecting portions 18', within the pixel contact holes CHP. The pixel electrodes 19 are obtained by appropriately patterning a transparent electrically-conductive film (thickness: 30 to 150 nm) of ITO, IZO, or the like.

The TFT substrate 100 of Embodiment 1 thus constructed includes proximate portions in its gate metal layer, whereby sites of ESD occurrence are appropriately controlled, thus being able to prevent unwanted short-circuiting between the gate metal layer and the SD layer.

Embodiment 2

Figure 14:
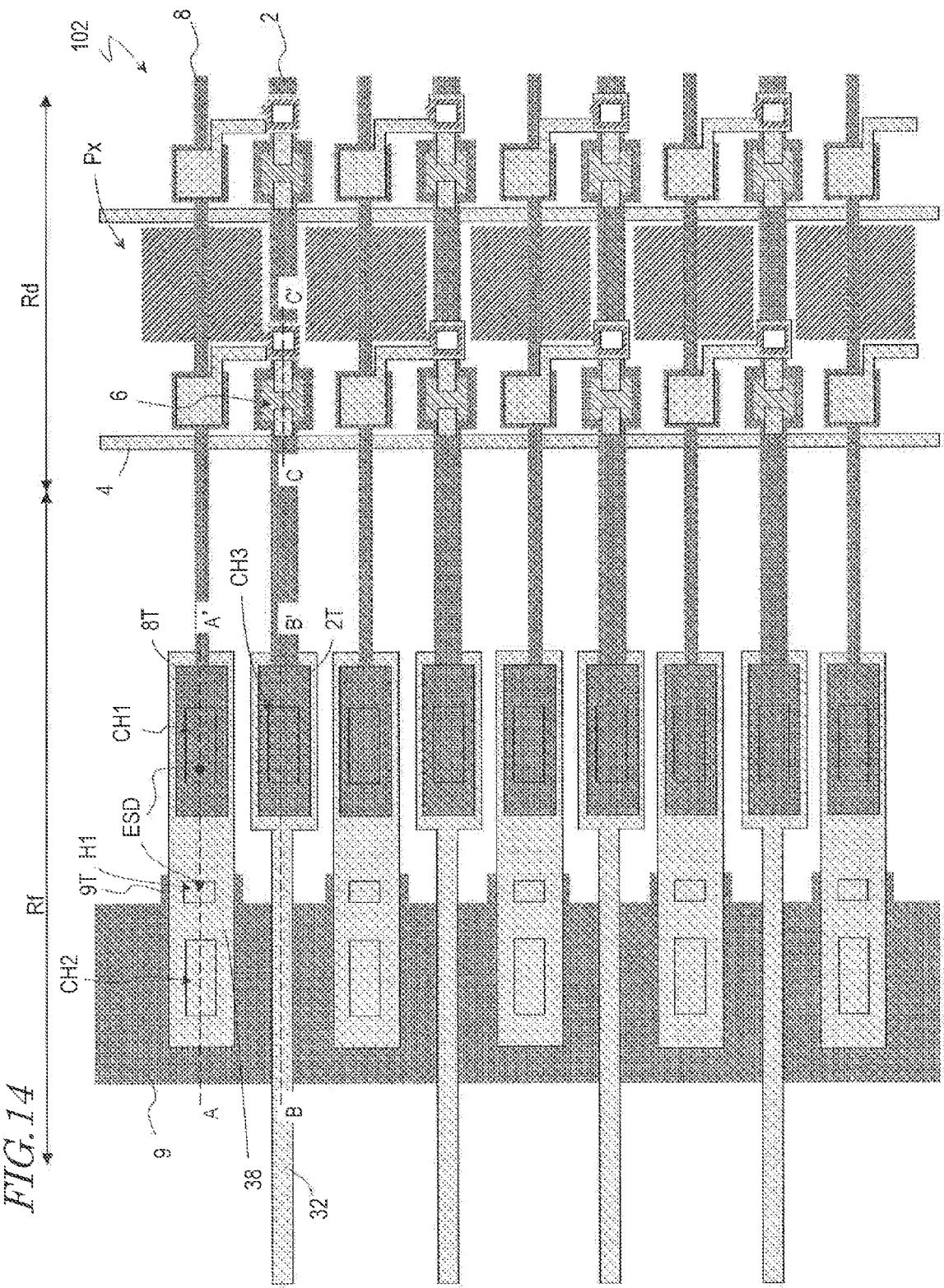
FIG. 14 A plan view showing the construction of a TFT substrate according to Embodiment 2 of the present invention.
Figure 15:
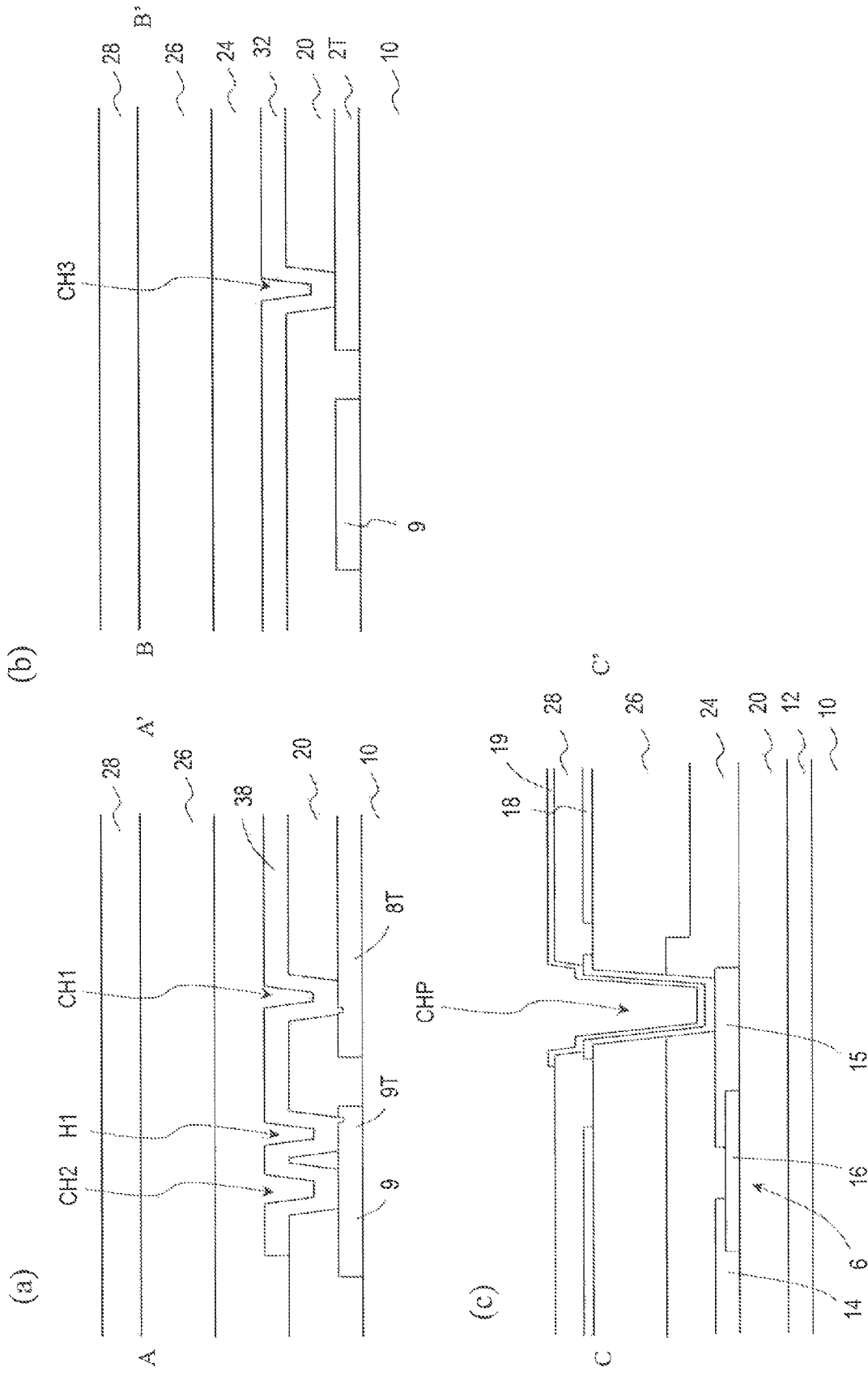
FIG. 15 (a) to (c) show cross sections taken along line A-A', line B-B', and line C-C' in FIG. 14, respectively.

FIG. 14 and FIGS. 15(a) to (c) show a semiconductor device (TFT substrate) 102 according to Embodiment 2. FIG. 14 shows a planar structure of the TFT substrate 102 in the region near the boundary between a displaying region Rd and a frame region Rf, whereas FIGS. 15(a) to (c) show cross sections taken along line A-A', line B-B', line C-C' in FIG. 14, respectively.

As shown in FIG. 15(c), TFTs 6 provided on the TFT substrate 102 differ from the TFT substrate 100 of Embodiment in that they are channel-etched type TFTs lacking an etching stopper layer 22. Constituent elements which are similar to those of the TFT substrate 100 of Embodiment 1 will be denoted by identical reference numerals, and their description will be omitted.

As shown in FIG. 14 and FIG. 15(a), in the TFT substrate 102, too, first and second contact holes CH1 and CH2 are provided at positions corresponding to the CS line end portions 8T and in the central portion of the CS stem 9. Through the contact holes CH1 and CH2, the CS lines 8 and the CS stem 9 are connected by CS connection portions 38.

Moreover, the CS stem 9 includes proximate portions 9T protruding toward the CS line end portions 8T, and first holes H1 are provided above the proximate portions 9T. Each first hole H1 is located between the first contact hole CH1 and the second contact hole CH2. The first contact hole CH1, the second contact hole CH2, and the first hole H1 are typically aligned on the same line, along the direction that the CS line 8 extends.

Moreover, as shown in FIG. 15(b) and the like, third contact holes CH3 are formed above the gate line end portions 2T. Through the third contact holes CH3, gate lead lines 32 are connected to the gate line end portions 2T. The gate lead lines 32 are insulated from the CS stem 9 by a gate dielectric layer 20.

In such a construction, too, protrusions (proximate portions) 9T of the CS stem 9 restrict sites of ESD occurrence. Typically, ESD is likely to occur on the inside of the first contact holes CH1 above the CS line end portions 8T and the first holes H1 above the CS stem proximate portions 9T.

Figure 16:
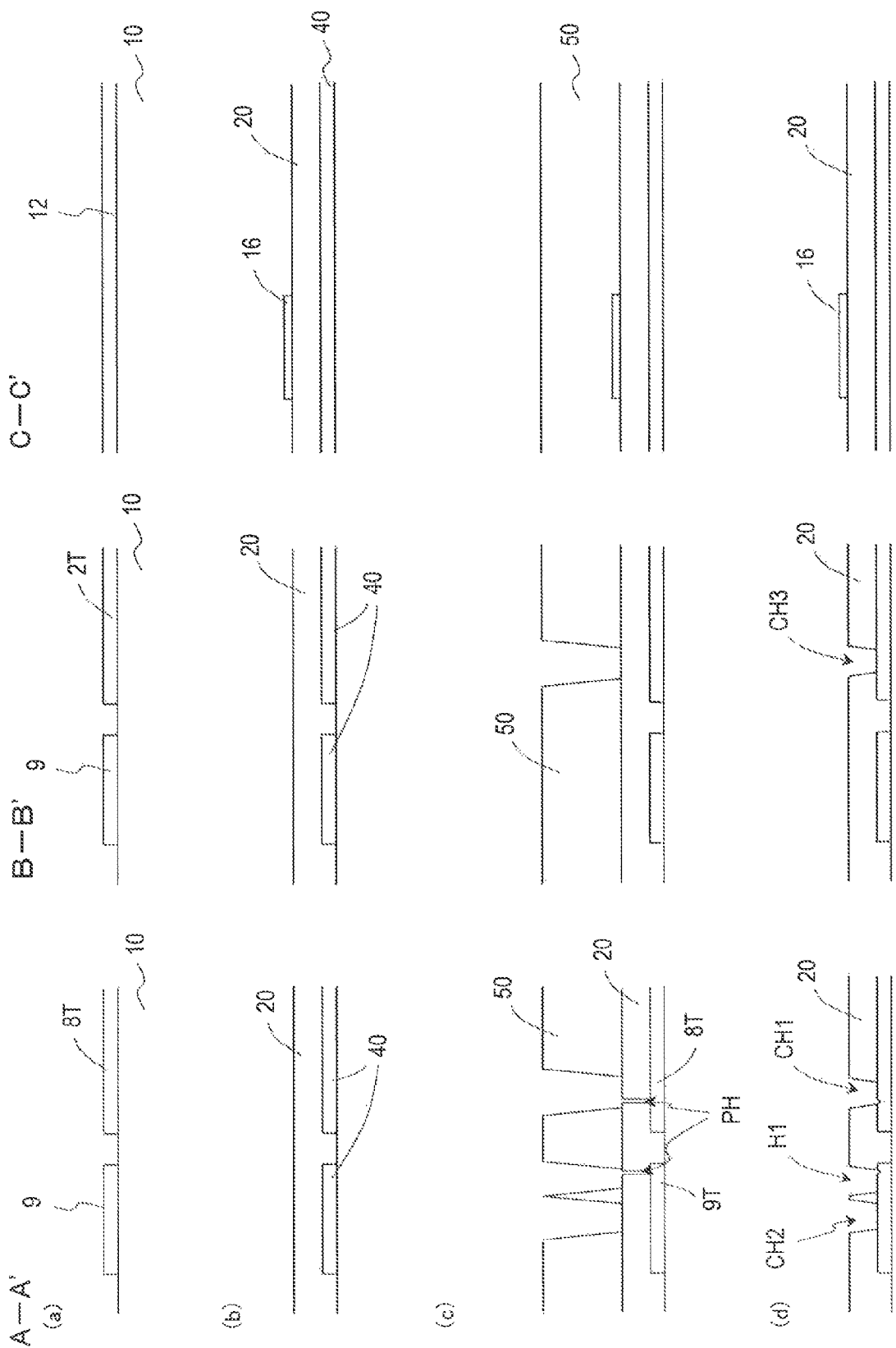
FIG. 16 Cross-sectionals view for describing production steps of the TFT substrate of Example 2, where (a) to (d) show respectively different steps.

Hereinafter, with reference to FIG. 16 to FIG. 18, a method of producing the TFT substrate 102 will be described.

First, as shown in FIG. 16(a), on a transparent substrate 10 made of glass, plastic, or the like, a gate metal layer 40 containing gate line end portions 2T, CS line end portions 8T, a CS stem 9, and the like are formed. The gate metal layer 40 is obtained by patterning a metal multilayer film of MoNb (thickness: 30 to 150 nm)/Al (thickness: 100 to 400 nm), for example.

Thereafter, as shown in FIG. 16(b), a gate dielectric layer 20 covering the gate metal layer 40 is formed. The gate dielectric layer 20 is obtained by stacking $SiO_2$ (thickness: 30 to 300 nm)/$SiN_x$ (thickness: 100 to 400 nm), for example. On the gate dielectric layer 20, a semiconductor layer 16 typically in island-like planar shapes is formed. The semiconductor layer 16 may be made of an oxide semiconductor having a thickness of 30 to 150 nm, for example.

Thereafter, as shown in FIGS. 16(c) and (d), a process of forming first to third contact holes CH1 to CH3 and first holes H1 at predetermined positions in the gate dielectric layer 20 is performed by using a photolithography technique.

At this time, a resist 50 is provided on the gate dielectric layer 20. In a development step of the resist 50 or the like, ESD occurs to create pinholes PH that penetrate through the gate dielectric layer 20 and possibly reach the gate metal layer. The pinholes PH primarily occur at positions corresponding to the proximate portions 9T (CS stem proximate portions 9T) of the CS stem 9 and at positions corresponding to the CS line end portions 8T.

However, during the course of forming the first contact holes CH1 and the first holes H1, the pinholes PH become merged with these. Incidentally, etching is easier to progress at positions where the pinholes PH were present in the gate dielectric layer 20, so that slight dents may be created on the surface of the gate metal layer.

Thereafter, as shown in FIG. 17(e), a step of forming an SD layer is performed. The SD layer is obtained by stacking MoNb (thickness: e.g. 100 nm)/Al (thickness: e.g. 200 nm)/MoNb (thickness: e.g. 100 nm), and patterning them.

The SD layer contains source lines 4, source electrodes 14, drain electrodes 15, CS counter electrodes 15' and the like to be provided in the displaying region Rd. The SD layer also contains gate lead lines 32, CS connection portions 38, and the like to be provided in the frame region Rf. Since no etching stopper layer is provided on the TFT substrate 102 of the present embodiment, a step of source-drain isolation is performed on the semiconductor layer 16 by etching the electrically-conductive film. In this construction, the source electrodes 14 and the drain electrodes 15 are formed directly upon the semiconductor layer 16.

In this step, at the CS stem proximate portions 9T (first holes H1) and the CS line end portions 8T (first contact holes CH1), which are sites of ESD occurrence, CS connection portions 38 are formed so as to be in contact with the CS stem 9 and the CS line end portions 8T. However, these portions are meant to be connected to the CS connection portions 38. On the other hand, insulation between the gate lead lines 32 and the CS stem 9 is maintained. Therefore, even if ESD occurs, unwanted short-circuiting will not occur, and defective conditions will not arise.

Thereafter, as shown in FIGS. 17(f) and (g) and FIGS. 18(h) to (j), a passivation layer 24 covering the TFTs 6, a planarization layer 26, a common electrode 18, an upper dielectric layer 28, pixel electrodes 19, and the like are provided. Steps shown in FIGS. 17(f) and (g) and FIGS. 18(h) to (j) respectively correspond to steps shown in FIGS. 12(g) and (h) and FIGS. 13(i) to (k), these steps being substantially similar; their description will therefore be omitted herein.

The TFT substrate 102 thus constructed includes proximate portions in its gate metal layer, whereby sites of ESD occurrence are appropriately controlled, thus being able to prevent unwanted short-circuiting between the gate metal layer and the SD layer.

Embodiment 3

Figure 19:
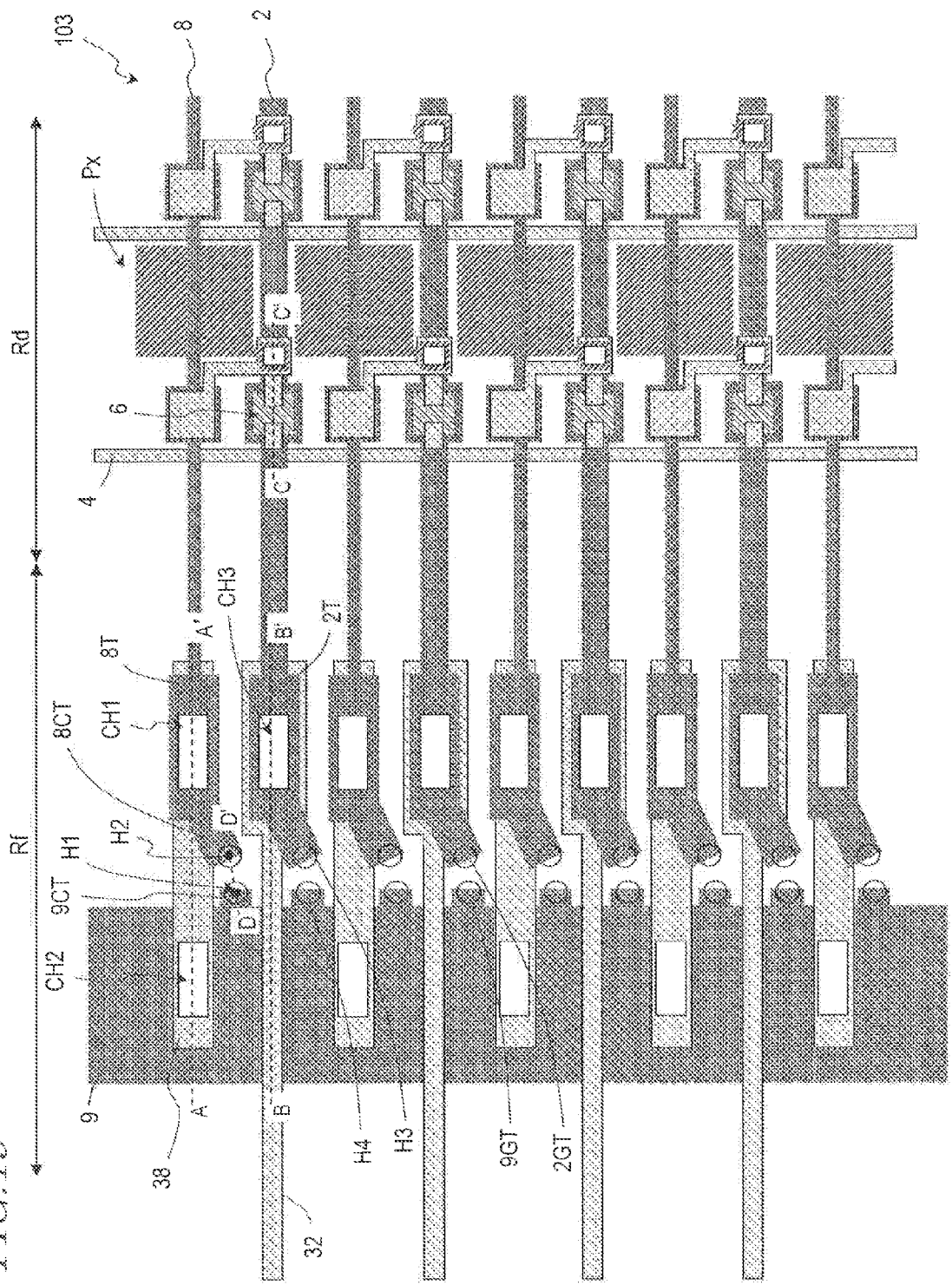
FIG. 19 A plan view showing the construction of a TFT substrate according to Embodiment 3 of the present invention.
Figure 20:
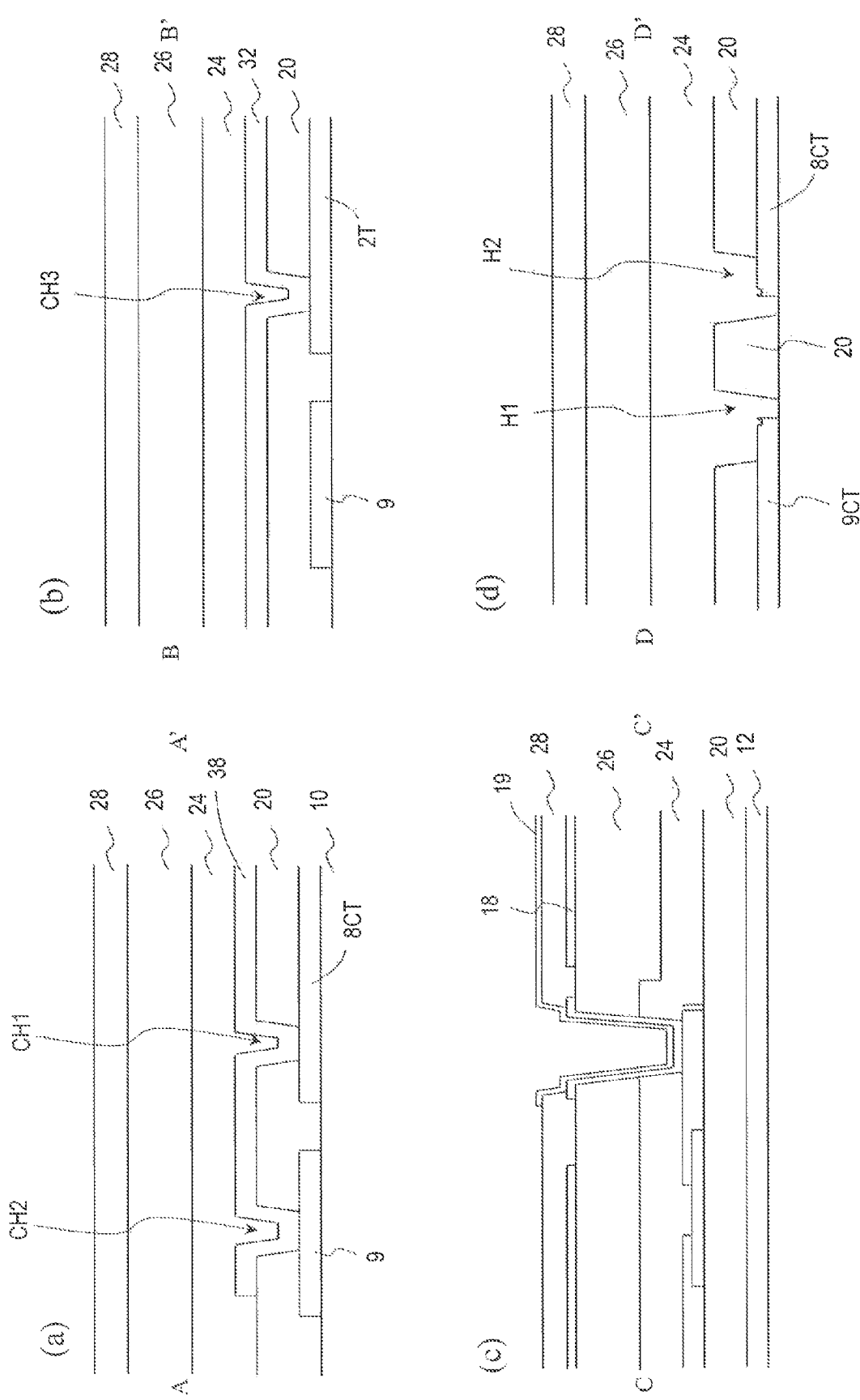
FIG. 20 (a) to (d) show cross sections taken along line A-A', line B-B', line C-C', and line D-D' in FIG. 19, respectively.

FIG. 19 and FIGS. 20(a) to (d) show a semiconductor device (TFT substrate) 103 according to Embodiment 3. FIG. 19 shows a planar structure of the TFT substrate 103 in the region near the boundary between a displaying region Rd and a frame region Rf, whereas FIGS. 20(a) to (d) show cross sections taken along line A-A', line B-B', line C-C', and line D-D' in FIG. 19, respectively. Constituent elements which are similar to those of the TFT substrates 100 and 102 of Embodiments 1 and 2 will be denoted by identical reference numerals, and their description will be omitted.

As shown in FIG. 19, in the TFT substrate 103, proximate portions 9CT (CS stem proximate portions 9CT) of the CS stem 9 are provided not upon extensions of the CS lines 8, but at positions which are shifted therefrom downward along the column direction, unlike in the TFT substrates 100 and 102 of Embodiments 1 and 2. More specifically, the proximate portions 9CT are located between extensions of the CS lines 8 and extensions of the gate lines 2.

Moreover, first holes H1 are formed in the gate dielectric layer 20 at positions above the CS stem proximate portions 9CT. In the present embodiment, only a portion of each first hole H1 overlaps the CS stem proximate portion 9CT. In other words, the first holes H1 are formed so as to expose not only the CS stem proximate portions 9CT (gate metal layer) but also the surface of the glass substrate 10 (or, in the case where a base coat layer or the like is provided, that surface) (see FIG. 20(d)).

Moreover, at CS line end portions 8T of the TFT substrate 103, proximate portions 8CT (CS line proximate portions 8CT) of the CS line 8, shaped so as to protrude toward the CS stem proximate portions 9CT, are provided. Each CS line proximate portion 8CT is a portion protruding in a direction constituting a predetermined acute angle with an extension of the CS line 8. The CS line proximate portion 8CT is placed so as to oppose the aforementioned CS stem proximate portion 9CT with a predetermined gap therebetween.

Moreover, second holes H2 are formed in the gate dielectric layer 20, at positions above the CS line proximate portions 8CT. In the present embodiment, only a portion of each second hole H2 overlaps the CS line proximate portion 8CT.

In this construction, the CS stem proximate portions 9CT and the first holes H1 disposed so as to partially overlap them are not covered by the CS connection portions 38 in the upper layer. Similarly, the CS line proximate portions 8CT and the second holes H2 disposed so as to partially overlap them are not covered by the CS connection portions 38 in the upper layer.

Therefore, even if pinholes due to ESD occur on the inside of the first holes H1 and the second holes H2, short-circuiting will not occur between the SD layer (CS connection portions 38) and the gate metal layer (CS line end portions 8T, CS stem 9). Furthermore, even if a CS connection portion 38 and a CS line proximate portion 8CT become short-circuited via a pinhole, these are meant to be connected anyway, so that defective conditions will not arise.

Furthermore, in the TFT substrate 103, the gate line end portions 2T also have proximate portions 2GT formed thereto, each proximate portion 2GT protruding toward the CS stem 9 in an oblique direction (a direction which is at a predetermined angle with respect to an extension of the gate line 2). Moreover, proximate portions 9GT for the gate line end portions are provided in the CS stem 9 so as to oppose the proximate portions 2GT. Corresponding to the proximate portions 2GT and 9GT, third holes H3 and fourth holes H4 are formed in the gate dielectric layer 20.

In this construction, the proximate portions 2GT of the gate lines 2 and the third holes H3 disposed so as to partially overlap them are not covered by the gate lead line 32 in the upper layer. Similarly, the proximate portions 9GT for the gate line end portions and the fourth holes H4 disposed so as to partially overlap them are not covered by the gate lead line 32 in the upper layer. Therefore, even if pinholes occur in the proximate portions 2GT of the gate lines 2, or in the proximate portions 9GT of the CS stem 9, short-circuiting will be prevented, thus preventing defective conditions.

Note that the proximate portions 2GT of the gate line end portions and the opposing proximate portions 9GT need not be provided. The third holes H3 and fourth holes H4 also need not be provided. In this case, too, it is ensured that ESD primarily occurs at the CS line proximate portions 8CT and the opposing CS stem proximate portions 9CT.

Figure 21:
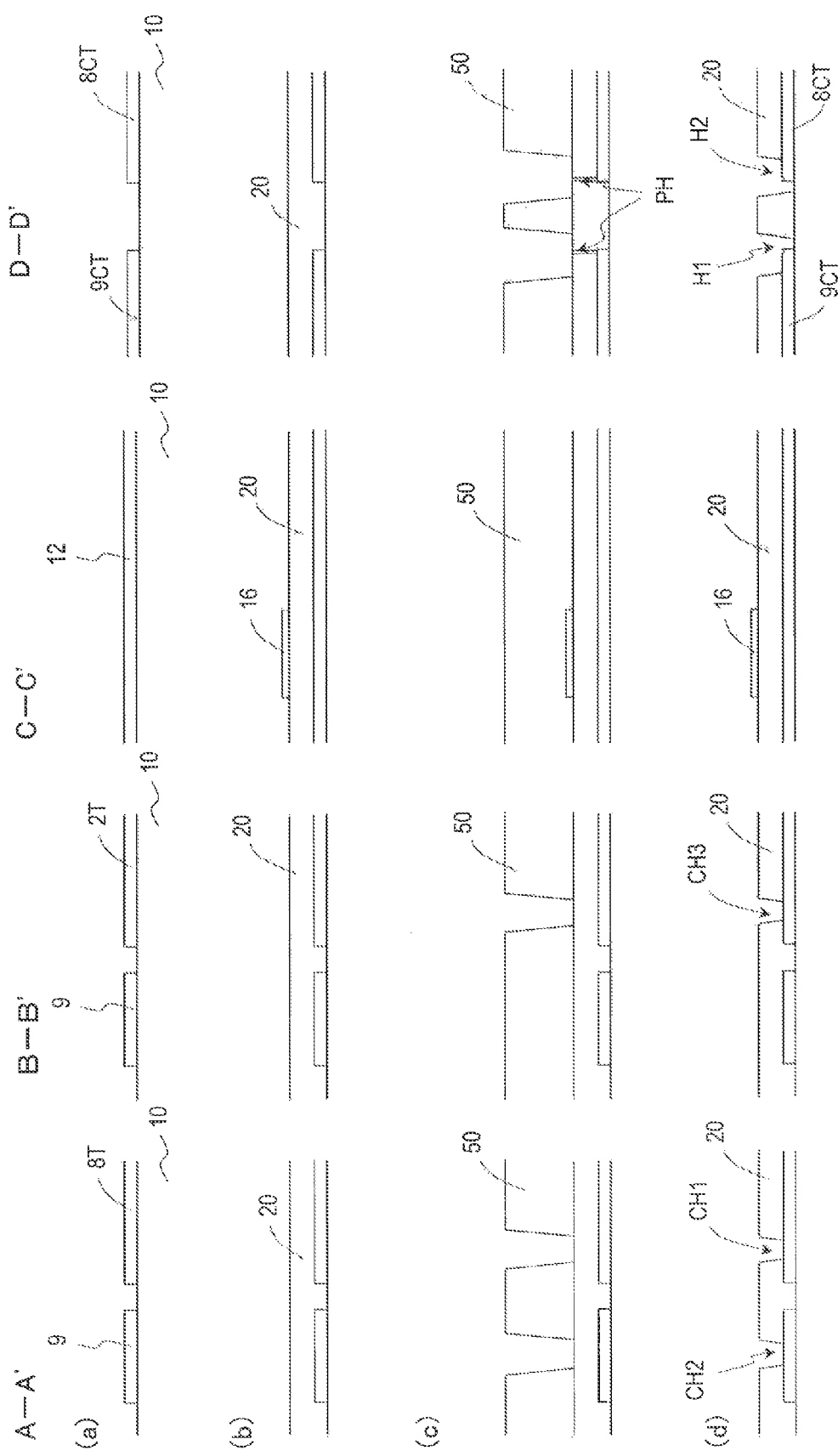
FIG. 21 Cross-sectionals view for describing production steps of the TFT substrate of Example 3, where (a) to (d) show respectively different steps.
Figure 22:
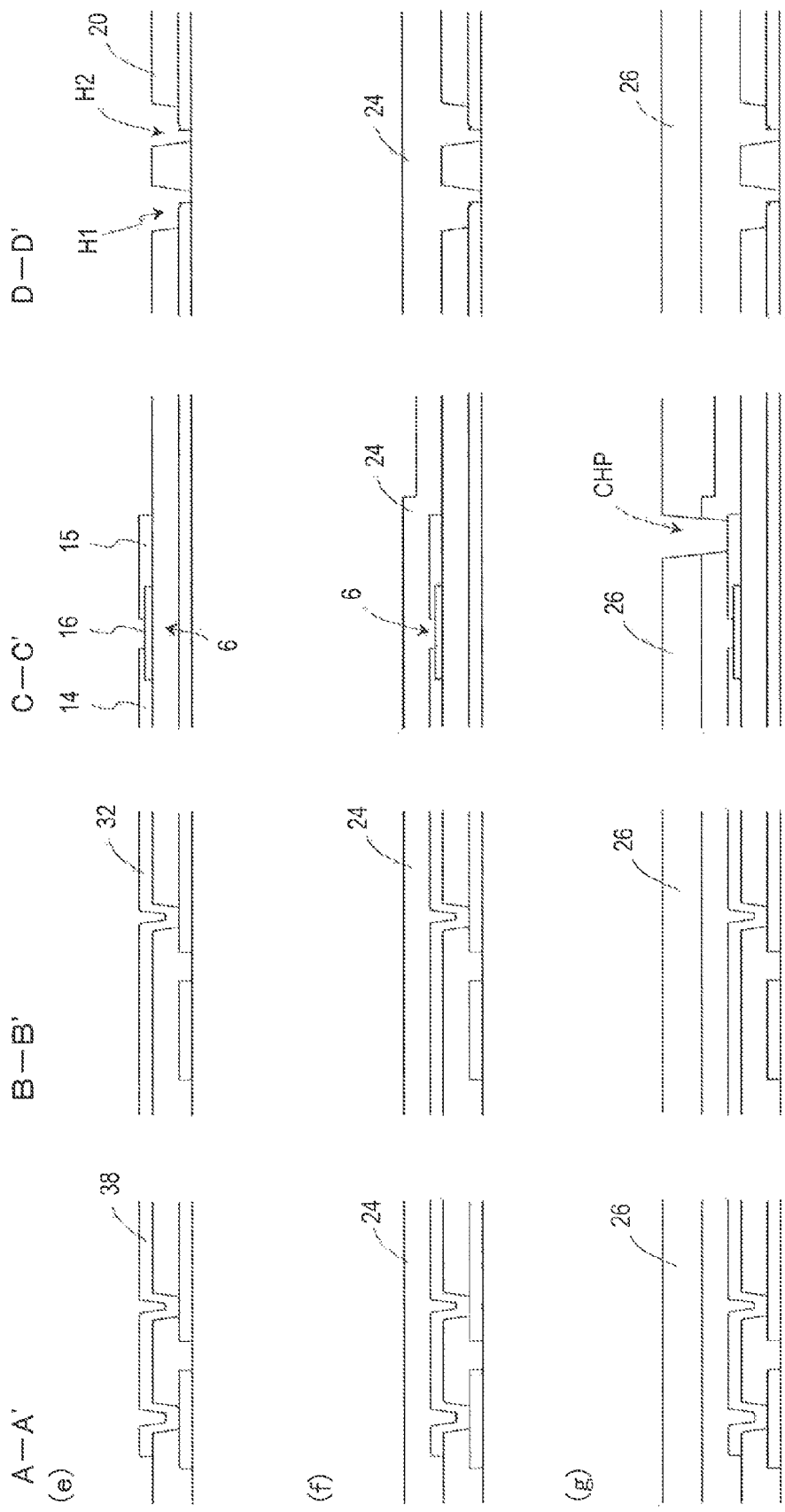
FIG. 22 Cross-sectionals view for describing production steps of the TFT substrate of Example 3, where (e) to (g) show respectively different steps.

Hereinafter, with reference to FIG. 21 and FIG. 22, a method of producing the TFT substrate 103 will be described.

First, with reference to FIGS. 21(a) and (b), on a transparent substrate 10, a gate metal layer containing gate electrodes 12, gate line end portions 2T, CS line end portions 8T, a CS stem 9, and the like is formed; thereafter, a gate dielectric layer 20 is formed; and thereafter, a semiconductor layer 16 typically in island-like planar shapes is formed. These steps are substantially similar to the steps shown in FIGS. 16(a) and (b).

Thereafter, as shown in FIGS. 21(c) and (d), a process of forming first to third contact holes CH1 to CH3 at predetermined positions in the gate dielectric layer 20 is performed by using a photolithography technique.

Moreover, in the present embodiment, as shown by D-D' cross sections (rightmost in the figure) in FIGS. 21(c) and (d), first holes H1 and second holes H2 are formed so as to partially overlap proximate portions 9CT of the CS stem and the CS line proximate portions 8CT. Although not shown, third holes H3 and fourth holes H4 are also formed in the same step.

At this time, a resist 50 is provided on the gate dielectric layer 20. ESD occurs in a development step of the resist 50 or the like. Moreover, ESD creates pinholes PH that penetrate through the gate dielectric layer 20 and possibly reach the gate metal layer. These pinholes PH primarily occur at the proximate portions 9CT of the CS stem 9 and the CS line proximate portions 8CT.

Thereafter, as shown in FIG. 22(e), a step of forming an SD layer is performed. In this step, no SD layer is provided in regions corresponding to the CS stem proximate portions 9CT (or first holes H1) and the CS line proximate portions 8CT (or second holes H2), which are sites of ESD occurrence. Therefore, defective conditions will not arise due to short-circuiting between the SD layer and the gate metal layer.

Figure 23:
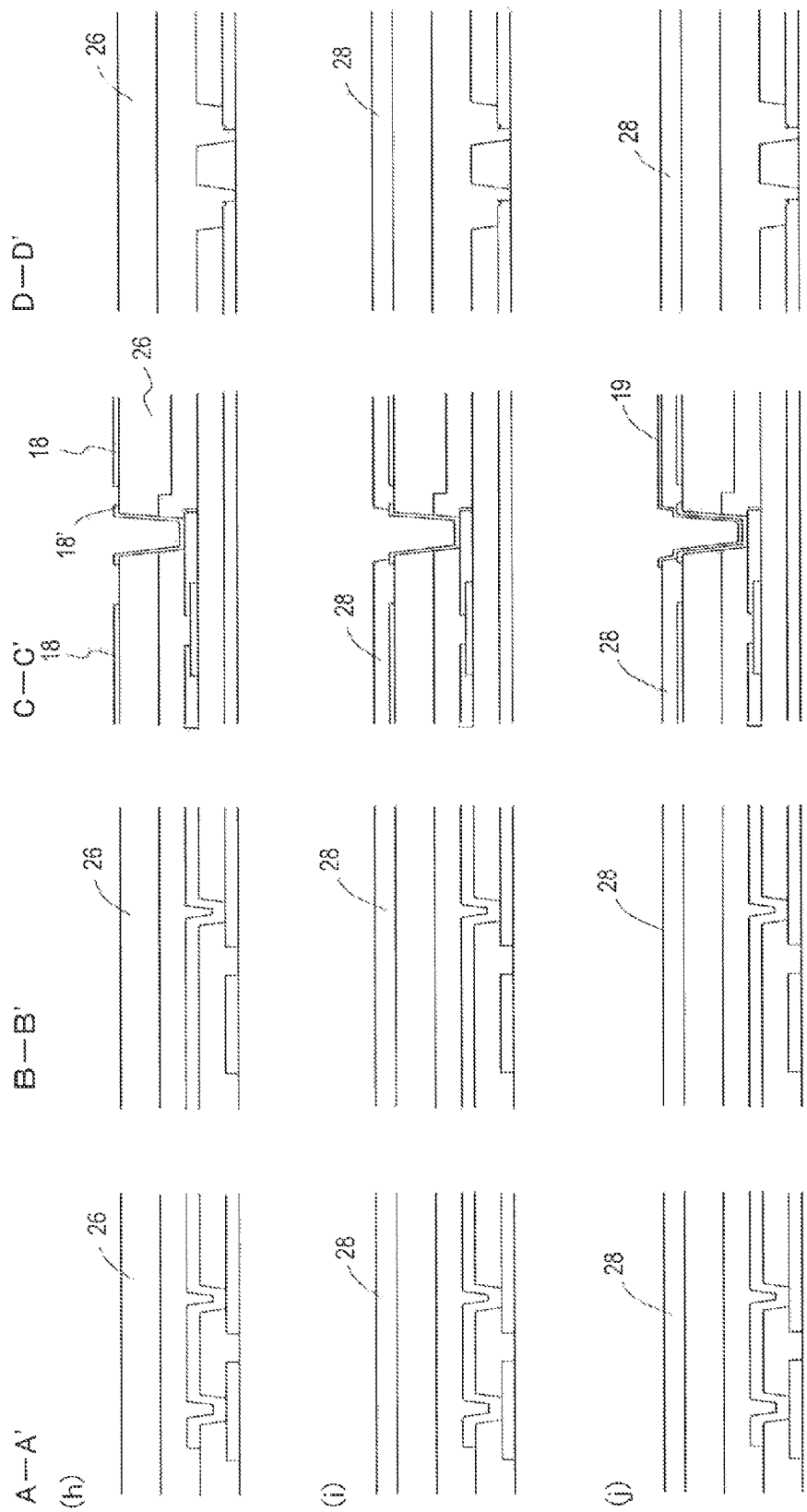
FIG. 23 Cross-sectionals view for describing production steps of the TFT substrate of Example 3, where (h) to (j) show respectively different steps.

Thereafter, as shown in FIGS. 22(f) and (g) and FIGS. 23(h) to (j), a passivation layer 24, a planarization layer 26, a common electrode 18, an upper dielectric layer 28, pixel electrodes 19, and the like are provided. Steps shown in FIGS. 22(f) and (g) and FIGS. 23(h) to (j) respectively correspond to steps shown in FIGS. 17(f) and (g) and FIGS. 18(h) to (j), these steps being substantially similar; their description will therefore be omitted herein.

In the TFT substrate 103 thus constructed, sites of ESD occurrence are appropriately controlled, whereby unwanted short-circuiting between the gate metal layer and the SD layer can be prevented.

Embodiment 4

Figure 24:
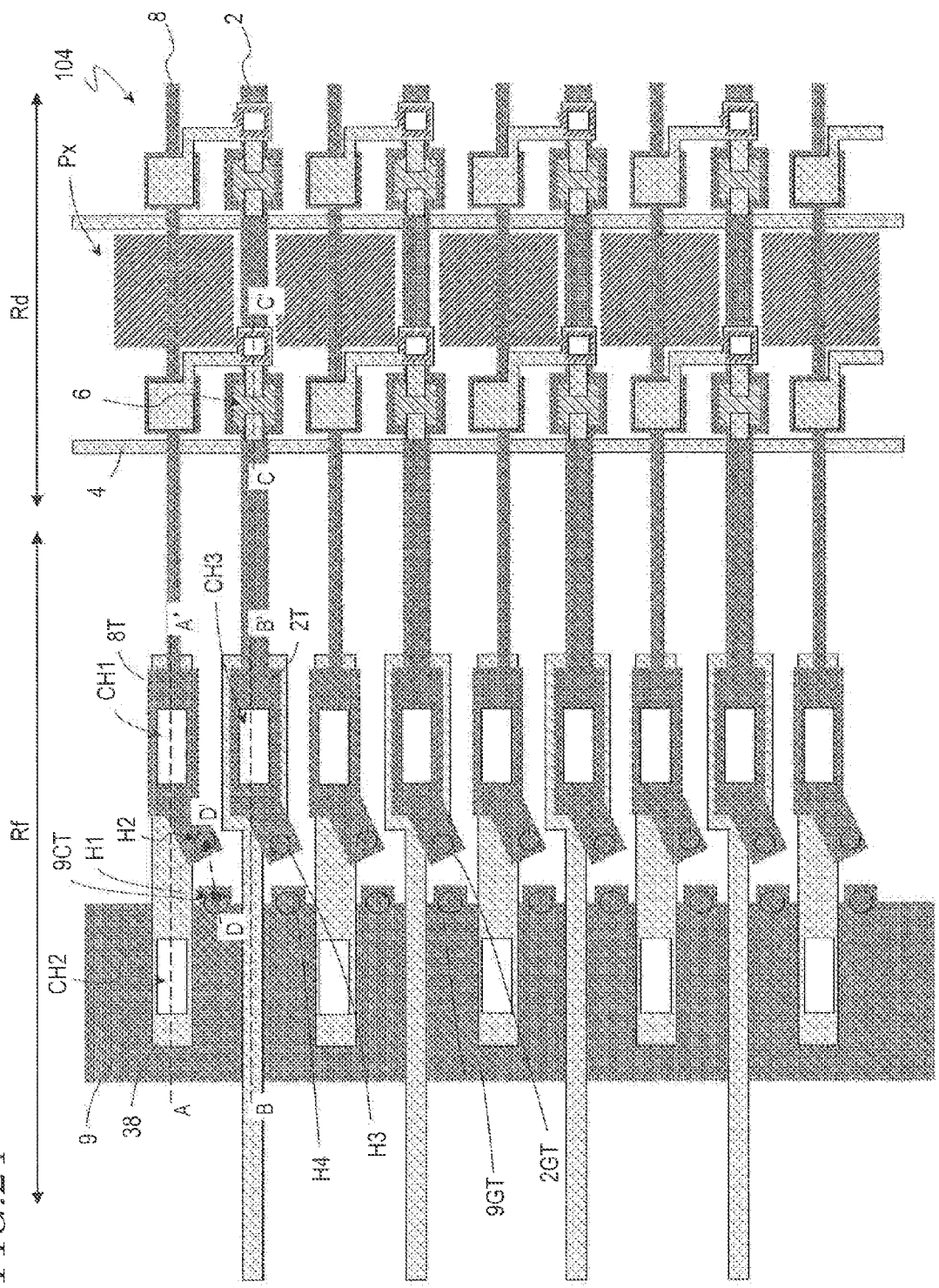
FIG. 24 A plan view showing the construction of a TFT substrate according to Embodiment 4 of the present invention.
Figure 25:
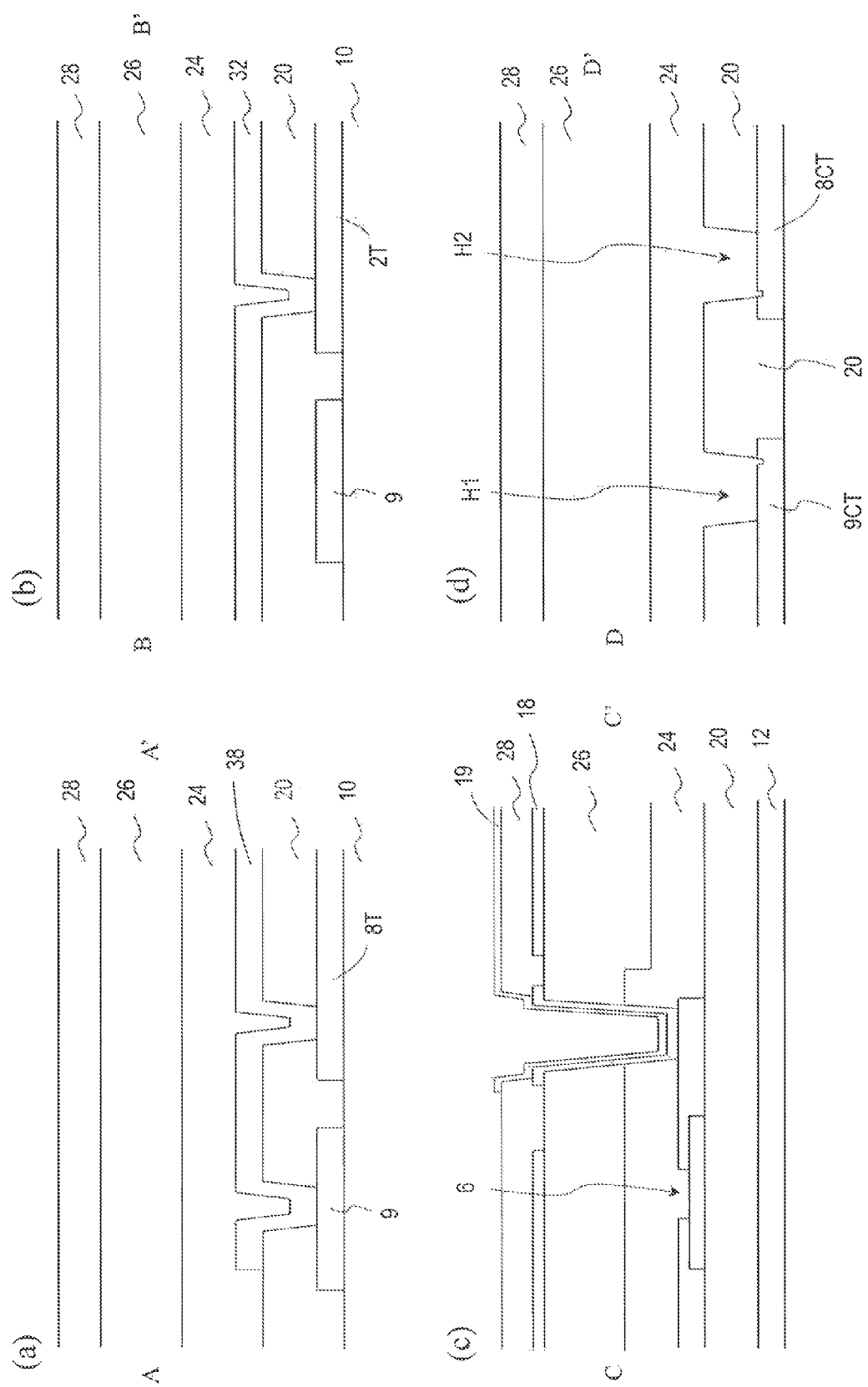
FIG. 25 (a) to (d) show cross sections taken along line A-A', line B-B', line C-C', and line D-D' in FIG. 24, respectively.

FIG. 24 and FIGS. 25(a) to (d) show a semiconductor device (TFT substrate) 104 according to Embodiment 4. FIG. 24 shows a planar structure of the TFT substrate 104 in the region near the boundary between a displaying region Rd and a frame region Rf, whereas FIGS. 25(a) to (d) show cross sections taken along line A-A', line B-B', line C-C', and line D-D' in FIG. 24, respectively. Constituent elements which are similar to those of the TFT substrates 100, 102, and 103 of Embodiments 1 to 3 will be denoted by identical reference numerals, and their description will be omitted.

As can be seen from FIG. 24 and FIGS. 25(a) to (d), the TFT substrate 104 of the present embodiment differs from the TFT substrate 103 (Embodiment 3) in that each first hole H1 is formed so that its entirety overlaps a CS stem proximate portion 9CT, and each second hole H2 is formed so that its entirety overlaps a CS line proximate portion 8CT. In this case, as shown in FIG. 25(d), the gate metal layer is exposed in the entire bottom faces of the first hole H1 and the second hole H2.

Thus, each first hole H1 and each second hole H2 may be arranged so that a portion thereof overlaps the gate metal layer (more specifically, the CS stem proximate portion 9CT and the CS line proximate portion 8CT)(Embodiment 3), or that its entirety overlaps the gate metal layer (Embodiment 4). An alternative implementation may be where only either one of the first hole H1 and the second hole H2 completely overlaps the gate metal layer.

The same is also true of third holes H3 which are provided corresponding to proximate portions 9GT for gate line end portions, and fourth holes H4 provided corresponding to gate line proximate portions 2GT: each third or fourth hole H3, H4 may overlap the gate metal layer in part or in whole. In either case, sites of ESD occurrence are appropriately controlled, whereby unwanted short-circuiting between the gate metal layer and the SD layer can be prevented.

Embodiment 5

Figure 26:
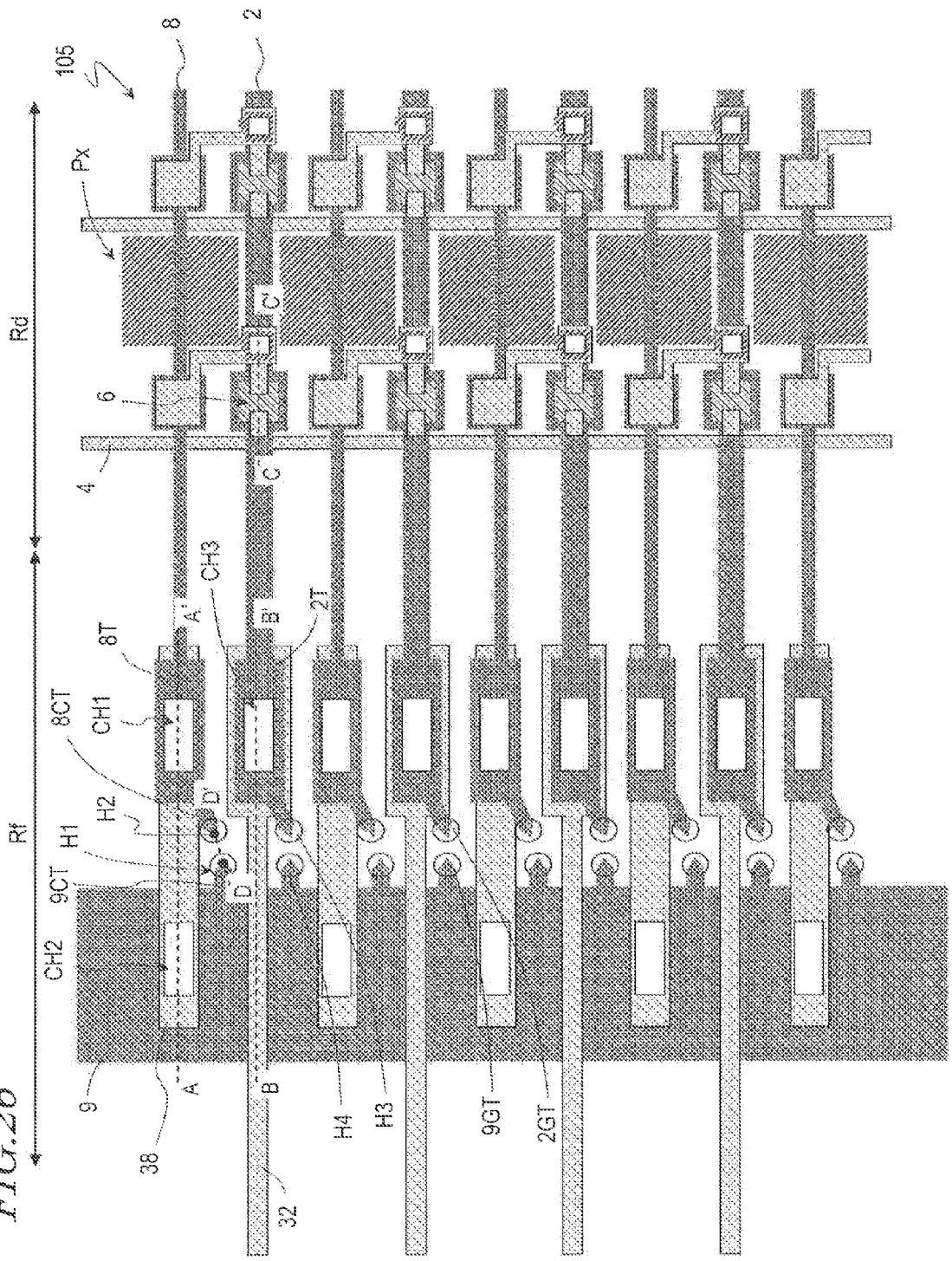
FIG. 26 A plan view showing the construction of a TFT substrate according to Embodiment 5 of the present invention.
Figure 27:
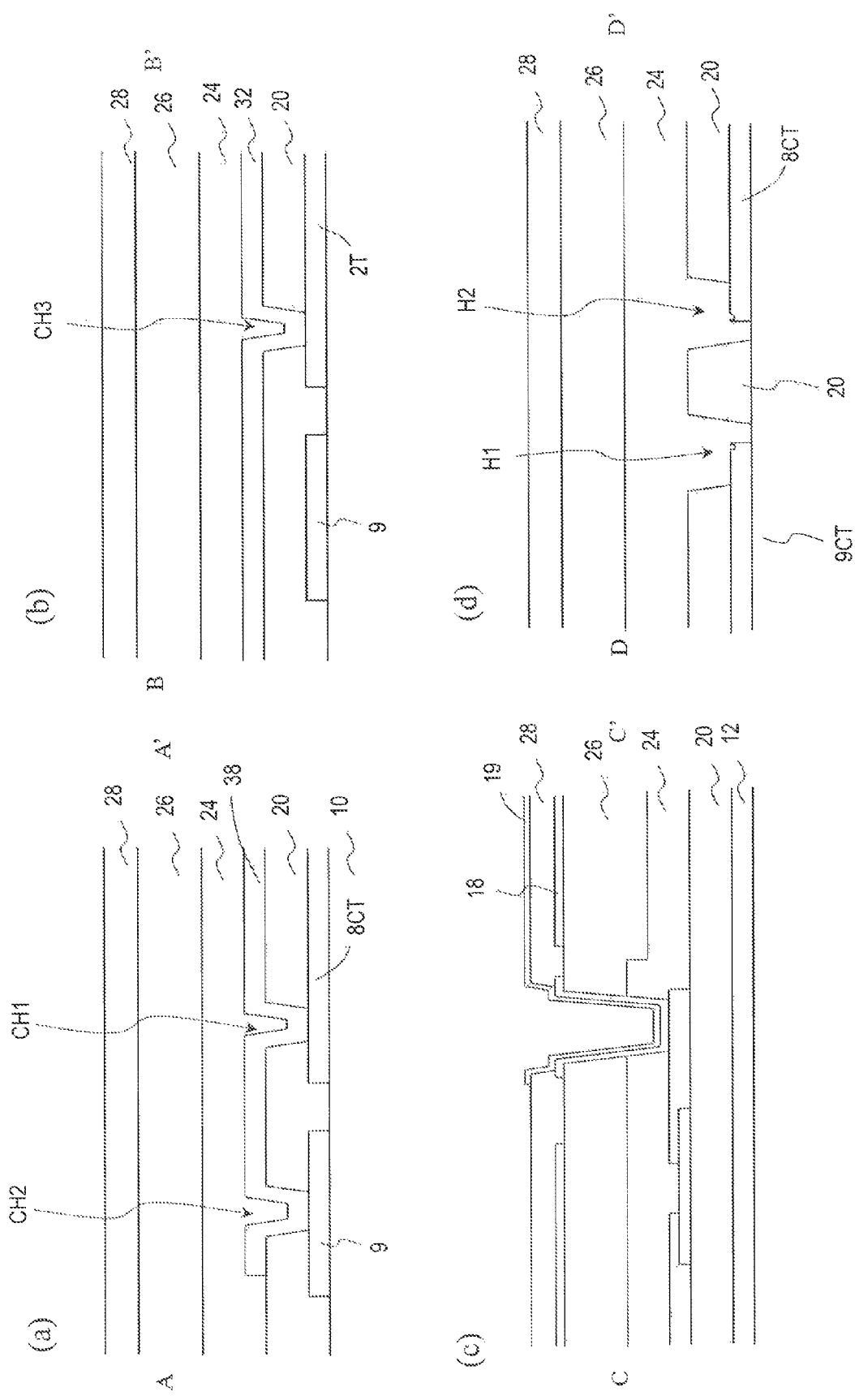
FIG. 27 (a) to (d) show cross sections taken along line A-A', line B-B', line C-C', and line D-D' in FIG. 26, respectively.

FIG. 26 and FIGS. 27(a) to (d) show a semiconductor device (TFT substrate) 105 according to Embodiment 5. FIG. 26 shows a planar structure of the TFT substrate 105 in the region near the boundary between a displaying region Rd and a frame region Rf, whereas FIGS. 27(a) to (d) show cross sections taken along line A-A', line B-B', line C-C', and line D-D' in FIG. 25, respectively. Constituent elements which are similar to those of the TFT substrates 100, 102, 103, and 104 of Embodiments 1 to 4 will be denoted by identical reference numerals, and their description will be omitted.

As can be seen from FIG. 26 and FIGS. 27(a) to (d), the TFT substrate 105 of the present embodiment differs from the TFT substrate 103 (Embodiment 3) in that tips of the CS stem proximate portions 9CT and the CS line proximate portions 8CT are pointed. By providing the CS stem proximate portions 9CT and CS line proximate portions 8CT of such pointed shapes, it becomes more likely that ESD occurs at these positions.

In the TFT substrate 105 thus constructed, sites of ESD occurrence are appropriately controlled, whereby unwanted short-circuiting between the gate metal layer and the SD layer can be prevented.

INDUSTRIAL APPLICABILITY

A semiconductor device according to an embodiment of the present invention is suitably used as a TFT substrate included in a display device, and so on.

REFERENCE SIGNS LIST 2 gate line
4 source line
6 TFT
8 CS line
8T CS line end portion
9 CS stem
9T CS stem proximate portion
10 transparent substrate
12 gate electrode
14 source electrode
15 drain electrode
16 semiconductor layer
18 common electrode
19 pixel electrode
20 gate dielectric layer
22 etching stopper layer
24 passivation layer
26 planarization layer
28 upper dielectric layer
100 TFT substrate CH1 first contact hole
CH2 second contact hole
CH3 third contact hole
H1 first hole
H2 second hole
H3 third hole
H4 fourth hole

The invention claimed is:

1. A semiconductor device comprising:
a substrate;
a first line being formed on the substrate and having a first end portion;
a second line having a second end portion located in a neighborhood of the first end portion, the second line being insulated from the first line;
a first electrically-conductive portion provided in the neighborhood of the first end portion and the second end portion, the first electrically-conductive portion being spaced apart from the first end portion and from the second end portion when viewed from a substrate normal direction, and extending in a different direction from that of the first line and the second line;
a dielectric layer covering the first line, the second line, and the first electrically-conductive portion; and
a second electrically-conductive portion provided on the dielectric layer, wherein,
when viewed from the substrate normal direction, the dielectric layer has a first contact hole at least partially overlapping the first end portion and a second contact hole at least partially overlapping the first electrically-conductive portion;
the second electrically-conductive portion is connected to the first end portion within the first contact hole and connected to the first electrically-conductive portion within the second contact hole to allow electrical conduction between the first end portion and the first electrically-conductive portion;
the second end portion is insulated from the first electrically-conductive portion;
the first electrically-conductive portion has a proximate portion protruding toward the first end portion in the neighborhood of the first end portion; and
the dielectric layer further has a first hole disposed so as to at least partially overlap the proximate portion of the first electrically-conductive portion when viewed from the substrate normal direction.

2. The semiconductor device of claim 1, wherein,
the dielectric layer has a third contact hole at least partially overlapping the second end portion, the semiconductor device further comprising:
a third electrically-conductive portion being electrically connected to the second end portion within the third contact hole, and being electrically insulated from the first end portion, the first electrically-conductive portion, and the second electrically-conductive portion.

3. The semiconductor device of claim 2, wherein the dielectric layer has an electrostatic discharge-damaged portion at least within the first hole, and the dielectric layer has no electrostatic discharge-damaged portion within the third contact hole.

4. The semiconductor device of claim 1, wherein the first hole penetrates through the dielectric layer to expose at least a portion of the proximate portion.

5. The semiconductor device of claim 1, wherein the first line and the second line are provided in a same layer, and the first line and the second line extend in parallel to each other.

6. The semiconductor device of claim 1, wherein the second electrically-conductive portion integrally covers the first contact hole, the second contact hole, and the first hole.

7. The semiconductor device of claim 1, wherein a distance between the first end portion and the proximate portion of the first electrically-conductive portion is smaller than a distance between the second end portion and the first electrically-conductive portion.

8. The semiconductor device of claim 1, wherein
the first end portion includes a line proximate portion protruding in a direction different from the direction that the first line extends; and
the proximate portion of the first electrically-conductive portion and the line proximate portion oppose each other.

9. The semiconductor device of claim 8, wherein the line proximate portion of the first end portion has a second hole different from the first contact hole.

10. The semiconductor device of claim 9, wherein the first hole and the second hole are not covered by the second electrically-conductive portion.

11. The semiconductor device of claim 8, wherein,
the second end portion of the second line includes a further line proximate portion protruding in a direction different from the direction that the second line extends;
the first electrically-conductive portion includes a further proximate portion at a position opposing the further line proximate portion, the further proximate portion protruding toward the further line proximate portion; and
when viewed from the substrate normal direction, the dielectric layer has a third hole at least partially overlapping the further line proximate portion and a fourth hole at least partially overlapping the further proximate portion.

12. The semiconductor device of claim 1, wherein the proximate portion of the first electrically-conductive portion includes a portion pointed toward the first end portion, and the first hole partially overlaps the pointed portion.

13. The semiconductor device of claim 1, further comprising a TFT, wherein a channel of the TFT comprises an oxide semiconductor.

14. The semiconductor device of claim 1, having a displaying region and a frame region outside the displaying region, wherein,
the first and second lines at least extend inside the displaying region; and
the first end portion and the second end portion are located in the frame region.

15. A semiconductor device comprising:
a first electrically-conductive layer including a first conduction pattern, a second conduction pattern, and a third conduction pattern, such that the first conduction pattern, the second conduction pattern, and the third conduction pattern are isolated from one another when viewed from a substrate normal direction;
a dielectric layer covering the first electrically-conductive layer; and
a second electrically-conductive layer on the dielectric layer, wherein,
the first conduction pattern and the second conduction pattern are electrically interconnected via a connection portion contained in the second electrically-conductive layer;
the third conduction pattern is insulated from the first and second conduction patterns; and the first conduction pattern includes a portion protruding toward the second conduction pattern, and the dielectric layer has a hole at least partially overlapping the protruding portion when viewed from the substrate normal direction, thereby allowing electrostatic discharge to primarily occur in the hole.

16. The semiconductor device of claim 13, wherein the oxide semiconductor is an In—Ga—Zn—O type semiconductor.

17. The semiconductor device of claim 16, wherein the In—Ga—Zn—O type semiconductor is a crystalline In—Ga—Zn—O type semiconductor.

18. The semiconductor device of claim 15, further comprising a TFT, wherein a channel of the TFT comprises an oxide semiconductor.

19. The semiconductor device of claim 18, wherein the oxide semiconductor is an In—Ga—Zn—O type semiconductor.

20. The semiconductor device of claim 19, wherein the In—Ga—Zn—O type semiconductor is a crystalline In—Ga—Zn—O type semiconductor.

\* \* \* \* \*